United States Patent
Tseng et al.

(10) Patent No.: US 11,823,749 B2
(45) Date of Patent: Nov. 21, 2023

(54) CAM CELL, CAM MEMORY DEVICE AND OPERATION METHOD THEREOF

(71) Applicant: MACRONIX INTERNATIONAL CO., LTD., Hsinchu (TW)

(72) Inventors: Po-Hao Tseng, Taichung (TW); Feng-Min Lee, Hsinchu (TW); Ming-Hsiu Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 202 days.

(21) Appl. No.: 17/471,193

(22) Filed: Sep. 10, 2021

(65) Prior Publication Data

US 2023/0090194 A1  Mar. 23, 2023

(51) Int. Cl.
| | |
|---|---|
| G11C 16/08 | (2006.01) |
| G11C 16/34 | (2006.01) |
| G11C 16/30 | (2006.01) |
| G11C 15/04 | (2006.01) |
| G11C 16/10 | (2006.01) |
| G11C 16/26 | (2006.01) |

(52) U.S. Cl.
CPC .......... *G11C 16/3404* (2013.01); *G11C 15/04* (2013.01); *G11C 16/08* (2013.01); *G11C 16/102* (2013.01); *G11C 16/26* (2013.01); *G11C 16/30* (2013.01)

(58) Field of Classification Search
CPC ..... G11C 16/3404; G11C 15/04; G11C 16/08; G11C 16/102; G11C 16/26; G11C 16/30; G11C 15/046
See application file for complete search history.

(56) References Cited

U.S. PATENT DOCUMENTS

| | | | |
|---|---|---|---|
| 6,317,349 B1 * | 11/2001 | Wong | G11C 15/046 365/49.17 |
| 7,092,289 B1 | 8/2006 | Wong | |
| 2004/0233719 A1 | 11/2004 | Yaoi et al. | |
| 2008/0278986 A1 * | 11/2008 | Sarin | G11C 15/046 365/49.17 |
| 2021/0064455 A1 | 3/2021 | Akel et al. | |

* cited by examiner

*Primary Examiner* — Xiaochun L Chen
(74) *Attorney, Agent, or Firm* — McClure, Qualey & Rodack, LLP

(57) ABSTRACT

The application provides a Content Addressable Memory (CAM) cell, a CAM memory device and an operation method thereof. The CAM cell includes: a plurality of parallel-coupled flash memory cells: wherein a storage data of the CAM cell is based on a combination of a plurality of threshold voltages of the parallel-coupled flash memory cells.

15 Claims, 11 Drawing Sheets

CAM CELL, CAM MEMORY DEVICE AND OPERATION METHOD THEREOF

TECHNICAL FIELD

The disclosure relates in general to a Content Addressable Memory (CAM) cell, CAM memory device and an operation method thereof, and particularly to a CAM cell, CAM memory device and an operation method thereof for implementing NOR flash In-memory searching (IMS) system.

BACKGROUND

As rising of big data and AI hardware accelerator, data comparing/searching is essential functions. Highly parallel searching is implemented by the existing ternary content addressable memory (TCAM).

Traditionally, a TCAM cell is realized by SRAM cells, which consumes 16 transistors and incurs significant leakage power. Emerging nonvolatile memories (NVMs), such as spin transfer torque magnetic RAM (MRAM), phase change memory (PCM), resistive RAM (ReRAM), and FeFET, etc., have been utilized to construct compact CAM cells due to their nonvolatility and high memory density. However, most of the existing CAM designs only exploit the single level cell (SLC) NVM. Moreover, the on/off ratio of these NVMs are too small which will induce bad matching accuracy and not suitable for the long search word design.

Thus, there needs a CAM cell, a CAM memory device and an operation method thereof, which provide high matching accuracy and is suitable for long search word design in implementing NOR flash in-memory searching (IMS) system.

SUMMARY

According to one embodiment, provided is a content addressable memory (CAM) cell including: a plurality of parallel-coupled flash memory cells; wherein a storage data of the CAM cell is based on a combination of a plurality of threshold voltages of the parallel-coupled flash memory cells.

According to another embodiment, provided is a content addressable memory (CAM) memory device including: a plurality of CAM cells each including a plurality of parallel-coupled flash memory cells, wherein a storage data of each of the CAM cells is based on a combination of a plurality of threshold voltages of the parallel-coupled flash memory cells of each of the CAM cells; a plurality of search lines coupled to the CAM cells; a plurality of match lines coupled to the CAM cells; a plurality of sensing amplifiers coupled to the match lines; and a decoder coupled to the sensing amplifiers, wherein when a plurality of search voltages are applied to the CAM cells via the search lines, the sensing amplifiers sense a plurality of match voltages on the match lines to generate a plurality of sensing results; and based on the sensing results, the decoder generates a match address indicating respective addresses of the matched CAM cells having matched search results.

According to yet another embodiment, provided is 11. An operation method for a content addressable memory (CAM) memory device, the operation method including: programming a plurality of CAM cells each including a plurality of parallel-coupled flash memory cells, wherein a storage data of each of the CAM cells is based on a combination of a plurality of threshold voltages of the parallel-coupled flash memory cells of each of the CAM cells, the CAM cells further coupled to a plurality of match lines; applying a plurality of search voltages to the CAM cells; sensing a plurality of match voltages on the match lines to generate a plurality of sensing results; and based on the sensing results, generating a match address indicating respective addresses of the matched CAM cells having matched search results.

Figure 1:
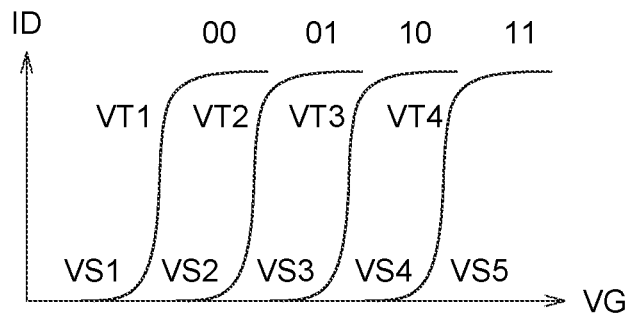
FIG. 1 shows a Content Addressable Memory (CAM) cell and operations thereof according to a first embodiment of the application.
Figure 1:
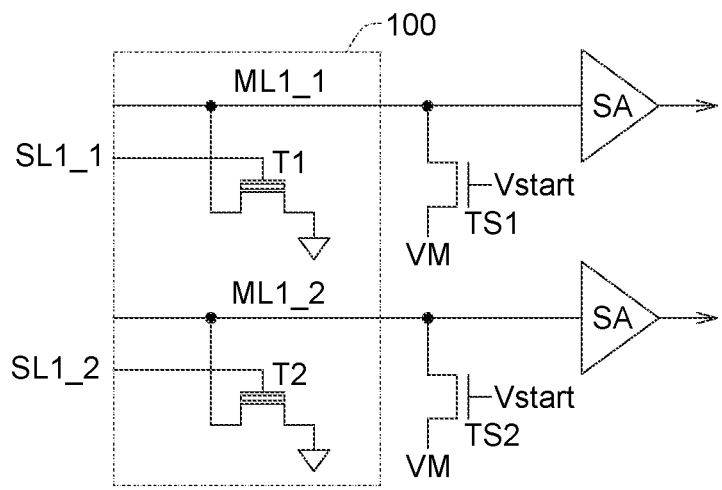

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

First Embodiment

FIG. 1 shows a Content Addressable Memory (CAM) cell and operations thereof according to a first embodiment of the application. As shown in FIG. 1, the CAM cell 100 according to the first embodiment of the application is for example but not limited by, a multi-level CAM cell storing two bits in one single cell.

The CAM cell 100 includes a plurality of parallel-coupled flash memory cells (for example, two transistors T1 and T2), herein the flash memory cells are for example but not limited by, floating gate memory cells, Silicon-Oxide-Nitride-Oxide-Silicon (SONOS) cells, floating dot memory cells, Spin-transfer torque Magneto resistive Random Access Memory (MRAM) cells, phase change memory (PCM) cells, ReRAM cells, Ferroelectric FET (FeFET) memory cells, conductive-bridging RAM (CBRAM) cells, and the similar memory cells.

Three terminals of the transistor T1 are coupled to a first search line SL1_1, a first match line ML1_1 and ground (GND), respectively. Similarly, three terminals of the transistor T2 are coupled to a second search line SL1_2, a second match line ML1_2 and ground (GND), respectively.

Besides, the transistors T1 and T2 are further coupled to starting transistors TS1 and TS2, respectively. Three terminals of the transistor TS1 are coupled to the first match line ML1_1, a start voltage Tstart and a charge voltage VM, respectively. Similarly, three terminals of the transistor TS2 are coupled to the second match line ML1_2, the start voltage Tstart and the charge voltage VM, respectively. The charge voltage VM is for example but not limited by, 0.6V-0.8V.

In FIG. 1, a plurality of sensing amplifiers SA are coupled to the first match line ML1_1 and the second match line ML1_2, respectively, for sensing voltages on the first match line ML1_1 and the second match line ML1_2. Sensing results of the sensing amplifiers represent whether voltages on the first match line ML1_1 and the second match line ML1_2 are kept potential or discharged. By decoding the sensing results from the sensing amplifiers SA, it is determined whether the search result is matched or mismatched.

Before the CAM cell 100 starts search, the start voltage Vstart turns on the start transistors TS1 and TS2 to charge the first match line ML1_1 and the second match line ML1_2 to the charge voltage VM. When the first match line ML1_1 and the second match line ML1_2 are charged to the charge voltage VM the start voltages turns off the start transistors TS1 and TS2.

The following table shows the search voltages, the threshold voltages and the search results according to the first embodiment of the application.

| Search data | 00 | 01 | 10 | 11 | WC |
|---|---|---|---|---|---|
| SL1_1 | VS1 | VS2 | VS3 | VS4 | VS1 |
| SL1_2 | VS2 | VS3 | VS4 | VS5 | VS5 |
| Storage data | 00 | 01 | 10 | 11 | XX |
| VT_T1 | VT1 | VT2 | VT3 | VT4 | VT4 |
| VT_T2 | VT1 | VT2 | VT3 | VT4 | VT1 |
| Search data | 00 | 01 | 10 | 11 | |
| ML1_1 | X | X | ○ | ○ | |
| ML1_2 | X | ○ | ○ | ○ | |

(Storage data: 01) (X: keeping voltage; ○: discharge)

In the first embodiment of the application, when threshold voltages VT_T1 and VT_T2 of the transistors T1 and T2 are both VT1, storage data of the CAM cell 100 is "00"; when threshold voltages VT_T1 and VT_T2 of the transistors T1 and T2 are both VT2, storage data of the CAM cell 100 is "01"; when threshold voltages VT_T1 and VT_T2 of the transistors T1 and T2 are both VT3, storage data of the CAM cell 100 is "10"; and when threshold voltages VT_T1 and VT_T2 of the transistors T1 and T2 are both VT4, storage data of the CAM cell 100 is "11" Further, when threshold voltages VT_T1 and VT_T2 of the transistors T1 and T2 are VT4 and VT1, respectively, storage data of the CAM cell 100 is "XX" (don't care).

In searching, when search voltages applied to the first search line SL1_1 and the second search line SL1_2 are VS1 and VS2, respectively, search data is "00", wherein the search data refers to data to be searched or compared; when search voltages applied to the first search line SL1_1 and the second search line SL1_2 are VS2 and VS3, respectively, search data is "01"; when search voltages applied to the first search line SL1_1 and the second search line SL1_2 are VS3 and VS4, respectively, search data is "10"; when search voltages applied to the first search line SL1_1 and the second search line SL1_2 are VS4 and VS5, respectively, search data is "11"; and when search voltages applied to the first search line SL1_1 and the second search line SL1_2 are VS1 and VS5, respectively, search data is "WC (wildcard)".

FIG. 1 further shows VI curve according to the first embodiment of the application, wherein the horizontal axis refers to the gate voltage VG while the vertical axis refers to the cell current ID. In the first embodiment of the application, the threshold voltages VT1, VT2, VT3 and VT4 are for example but not limited by, 1V, 2V, 3V and 4V; and the search voltages VS1, VS2, VS3, VS4 and VT5 are for example but not limited by 0.5V, 1.5V, 2.5V, 3.5V and 4.5V.

Search operations in the first embodiment are described in the following by the case that the storage data of the CAM cell 100 is "01" wherein the threshold voltages VT_V1 and VT_T2 of the transistors T1 and T2 are both VT2 (in the above case, VT2 is 2V). When the search data is "00" (the search voltages applied to the first search line SL1_1 and the second search line SL1_2 are VS1 (0.5V) and VS2 (1.5V)), the threshold voltage VT_T1 of the transistor T1 is VT2 (2V) while the search voltage applied to the first search line SL1_1 is VS1 (0.5V), and thus, the transistor T1 is turned off to keep potential of the first match line ML1_1; and the threshold voltage VT_T2 of the transistor T2 is VT2 (2V) while the search voltage applied to the second search line SL1_2 is VS2 (1.5V), and thus, the transistor T2 is turned off to keep potential of the second match line ML1_2. Similarly, when the search data is "01" (the search voltages applied to the first search line SL1_1 and the second search line SL1_2 are VS2 (1.5V) and VS3 (2.5V)), the threshold voltage VT_T1 of the transistor T1 is VT2 (2V) while the search voltage applied to the first search line SL1_1 is VS2 (1.5V), and thus, the transistor T1 is turned off to keep potential of the first match line ML1_1; and the threshold voltage VT_T2 of the transistor T2 is VT2 (2V) while the search voltage applied to the second search line SL1_2 is VS3 (2.5V), and thus, the transistor T2 is turned on to discharge the second match line ML1_2. Similarly, when the search data is "10" (the search voltages applied to the first search line SL1_1 and the second search line SL1_2 are VS3 (2.5V) and VS4 (3.5V)), the threshold voltage VT_T1 of the transistor T1 is VT2 (2V) while the search voltage applied to the first search line SL1_1 is VS3 (2.5V), and thus, the transistor T1 is turned on to discharge the first match line ML1_1; and the threshold voltage VT_T2 of the transistor T2 is VT2 (2V) while the search voltage applied to the second search line SL1_2 is VS4 (3.5V), and thus, the transistor T2 is turned on to discharge the second match line ML1_2. Similarly, when the search data is "11" (the search voltages applied to the first search line SL1_1 and the second search line SL1_2 are VS4 (3.5V) and VS5 (4.5V)), the threshold voltage VT_T1 of the transistor T1 is VT2 (2V) while the search voltage applied to the first search line SL1_1 is VS4 (3.5V), and thus, the transistor T1 is turned on to discharge the first match line ML1_1; and the threshold voltage VT_T2 of the transistor T2 is VT2 (2V) while the search voltage applied to the second search line SL1_2 is VS5 (4.5V), and thus, the transistor T2 is turned on to discharge the second match line ML1_2.

Thus, in the first embodiment of the application, when the voltage on the first match line ML1_1 is kept while the second match line ML1_2 is discharged, the storage data is matched with the search data; when the voltage on the first match line ML1_1 is kept while the voltage on the second match line ML1_2 is kept, the storage data is mismatched with the search data; and when both the first match line ML1_1 and the second match line ML1_2 are discharged, the storage data is mismatched with the search data.

The following table shows a search table according to the first embodiment of the application.

|  | Storage data 00 | Storage data 01 | Storage data 10 | Storage data 11 | Storage data XX |
|---|---|---|---|---|---|
| Search data 00 | match<br>ML1_1: X<br>ML1_2: ○ | mismatch<br>ML1_1: X<br>ML1_2: X | mismatch<br>ML1_1: X<br>ML1_2: X | mismatch<br>ML1_1: X<br>ML1_2: X | match<br>ML1_1: X<br>ML1_2: ○ |
| Search data 01 | mismatch<br>ML1_1: ○<br>ML1_2: ○ | match<br>ML1_1: X<br>ML1_2: ○ | mismatch<br>ML1_1: X<br>ML1_2: X | mismatch<br>ML1_1: X<br>ML1_2: X | match<br>ML1_1: X<br>ML1_2: ○ |
| Search data 10 | mismatch<br>ML1_1: ○<br>ML1_2: ○ | mismatch<br>ML1_1: ○<br>ML1_2: ○ | match<br>ML1_1: X<br>ML1_2: ○ | mismatch<br>ML1_1: X<br>ML1_2: X | match<br>ML1_1: X<br>ML1_2: ○ |
| Search data 11 | mismatch<br>ML1_1: ○<br>ML1_2: ○ | mismatch<br>ML1_1: ○<br>ML1_2: ○ | mismatch<br>ML1_1: ○<br>ML1_2: ○ | match<br>ML1_1: X<br>ML1_2: ○ | match<br>ML1_1: X<br>ML1_2: ○ |
| Search data WC | match<br>ML1_1: X<br>ML1_2: ○ | match<br>ML1_1: X<br>ML1_2: ○ | match<br>ML1_1: X<br>ML1_2: ○ | match<br>ML1_1: X<br>ML1_2: ○ | match<br>ML1_1: X<br>ML1_2: ○ |

As shown in the above table, when the storage data is "00" while the search data is "00", the voltage on the first match line ML1_1 is kept while the second match line ML1_2 is discharged which represents the search result is match; and when the storage data is "00" while the search data is "01", both the first match line ML1_1 and the second match line ML1_2 are discharged which represents the search result is mismatch. When the storage data is "XX", no matter the search data is "00", "01", "10" or "11", the voltage on the first match line ML1_1 is kept while the second match line ML1_2 is discharged which represents the search result is match. When the search data is "WC", no matter the storage data is "00", "01", "10" or "11", the voltage on the first match line ML1_1 is kept while the second match line ML1_2 is discharged which represents the search result is match.

In the first embodiment of the application, the threshold voltage (i.e. a first threshold voltage) of the first transistor T1 is the same as the threshold voltage (i.e. a second threshold voltage) of the second transistor T2; and the first search voltage (i.e. the search voltage applied to the first search line SL1_1) is lower than the second search voltage (i.e. the search voltage applied to the second search line SL1_2); when the storage data is a first predetermined storage data (i.e. "00"), the first and the second threshold voltages are both a minimum threshold voltage; and when the storage data is a second predetermined storage data (i.e. "11"), the first and the second threshold voltages are both a maximum threshold voltage. Further, when the storage data is a third predetermined storage data (i.e. "XX" (don't care)), one of the threshold voltages VT_T1 and VT_T2 of the transistors T1 and T2 is a minimum threshold voltage and another of the threshold voltages VT_T1 and VT_T2 of the transistors T1 and T2 is a maximum threshold voltage.

That is, in the first embodiment of the application, storage data of the CAM cell is based on combination of the first threshold voltage and the second threshold voltage.

Second Embodiment

Figure 2:
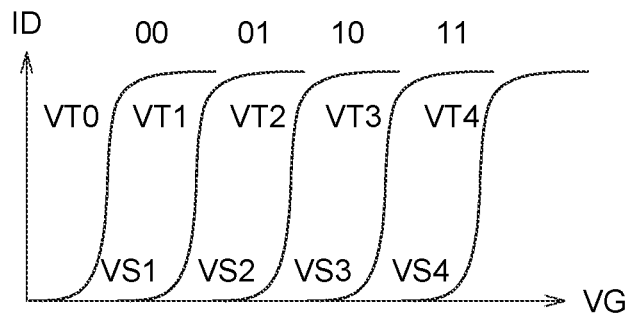
FIG. 2 shows a CAM cell and operations thereof according to a second embodiment of the application.
Figure 2:
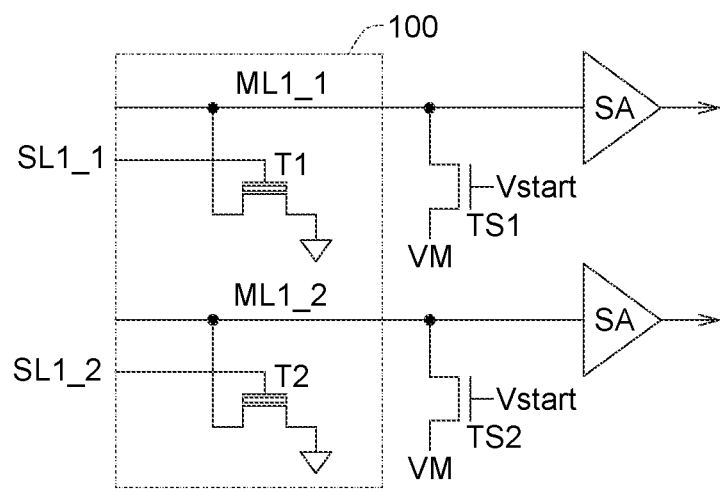

FIG. 2 shows a CAM cell and operations thereof according to a second embodiment of the application. Difference between the second embodiment and the first embodiment is described.

In the second embodiment of the application, values of the threshold voltages VT0, VT1, VT2, VT3 and VT4 are for example but not limited by, 0V, 1V, 2V, 3V and 4V; and values of the search voltages VS1, VS2, VS3 and VS4 are for example but not limited by, 0.5V, 1.5V, 2.5V and 3.5V.

The following table shows the search voltages, the threshold voltages and the search results according to the second embodiment of the application.

| Search data | 00 | 01 | 10 | 11 | WC |
|---|---|---|---|---|---|
| SL1_1 | VS1 | VS2 | VS3 | VS4 | VS1 |
| SL1_2 | VS1 | VS2 | VS3 | VS4 | VS4 |
| Storage data | 00 | 01 | 10 | 11 | XX |
| VT_T1<br>VT_T2 | VT1<br>VT0 | VT2<br>VT1 | VT3<br>VT2 | VT4<br>VT3 | VT4<br>VT0 |
| Search data | 00 | 01 | 10 | 11 | |
| ML1_1<br>ML1_2 | X<br>X | X<br>○ | ○<br>○ | ○<br>○ | |

(Storage data: 01) (X: keep potential; ○: discharge)

Search operations in the second embodiment are described in the following by the case that the storage data of the CAM cell 100 is "01" wherein the threshold voltages VT_V1 and VT_T2 of the transistors T1 and T2 are VT2 and VT1, respectively). When the search data is "00" (the search voltages applied to the first search line SL1_1 and the second search line SL1_2 are both VS1 (0.5V)), the threshold voltage VT_T1 of the transistor T1 is VT2 (2V) while the search voltage applied to the first search line SL1_1 is VS1 (0.5V), and thus, the transistor T1 is turned off to keep potential of the first match line ML1_1; and the threshold voltage VT_T2 of the transistor T2 is VT1 (1V) while the search voltage applied to the second search line SL1_2 is VS1 (0.5V), and thus, the transistor T2 is turned off to keep potential of the second match line ML1_2. Similarly, when the search data is "01" (the search voltages applied to the first search line SL1_1 and the second search line SL1_2 are both VS2 (1.5V)), the threshold voltage VT_T1 of the transistor T1 is VT2 (2V) while the search voltage applied to the first search line SL1_1 is VS2 (1.5V), and thus, the transistor T1 is turned off to keep potential of the first match line ML1_1; and the threshold voltage VT_T2 of the transistor T2 is VT1 (1V) while the search voltage applied to the second search line SL1_2 is VS2 (1.5V), and thus, the transistor T2 is turned on to discharge the second match line ML1_2. Similarly, when the search data is "10" (the search voltages applied to the first search line SL1_1 and the second search line SL1_2 are both VS3 (2.5V)), the threshold voltage VT_T1 of the transistor T1 is VT2 (2V) while the search voltage applied to the first search line SL1_1 is VS3 (2.5V), and thus, the transistor T1 is turned on to discharge the first match line ML1_1; and the threshold voltage VT_T2 of the transistor T2 is VT1 (1V) while the search voltage applied to the second search line SL1_2 is VS3 (2.5V), and thus, the transistor T2 is turned on to discharge the second match line ML1_2. Similarly, when the search data is "11" (the search voltages applied to the first search line SL1_1 and the second search line SL1_2 are both VS4 (3.5V)), the threshold voltage VT_T1 of the transistor T1 is VT2 (2V) while the search voltage applied to the first search line SL1_1 is VS4 (3.5V), and thus, the transistor T1 is turned on to discharge the first match line ML1_1; and the threshold voltage VT_T2 of the transistor T2 is VT1 (1V) while the search voltage applied to the second search line SL1_2 is VS5 (4.5V), and thus, the transistor T2 is turned on to discharge the second match line ML1_2.

Thus, in the second embodiment of the application, when the voltage on the first match line ML1_1 is kept while the second match line ML1_2 is discharged, the storage data is matched with the search data; when the voltage on the first match line ML1_1 is kept while the voltage on the second match line ML1_2 is kept, the storage data is mismatched with the search data; and when both the first match line ML1_1 and the second match line ML1_2 are discharged, the storage data is mismatched with the search data.

The following table shows a search table according to the second embodiment of the application.

|  | Storage data 00 | Storage data 01 | Storage data 10 | Storage data 11 | Storage data XX |
|---|---|---|---|---|---|
| Search data 00 | match<br>ML1_1: X<br>ML1_2: ◯ | mismatch<br>ML1_1: X<br>ML1_2: X | mismatch<br>ML1_1: X<br>ML1_2: X | mismatch<br>ML1_1: X<br>ML1_2: X | match<br>ML1_1: X<br>ML1_2: ◯ |
| Search data 01 | mismatch<br>ML1_1: ◯<br>ML1_2: ◯ | match<br>ML1_1: X<br>ML1_2: ◯ | mismatch<br>ML1_1: X<br>ML1_2: X | mismatch<br>ML1_1: X<br>ML1_2: X | match<br>ML1_1: X<br>ML1_2: ◯ |
| Search data 10 | mismatch<br>ML1_1: ◯<br>ML1_2: ◯ | mismatch<br>ML1_1: ◯<br>ML1_2: ◯ | match<br>ML1_1: X<br>ML1_2: ◯ | mismatch<br>ML1_1: X<br>ML1_2: X | match<br>ML1_1: X<br>ML1_2: ◯ |
| Search data 11 | mismatch<br>ML1_1: ◯<br>ML1_2: ◯ | mismatch<br>ML1_1: ◯<br>ML1_2: ◯ | mismatch<br>ML1_1: ◯<br>ML1_2: ◯ | match<br>ML1_1: X<br>ML1_2: ◯ | match<br>ML1_1: X<br>ML1_2: ◯ |
| Search data WC | match<br>ML1_1: X<br>ML1_2: ◯ | match<br>ML1_1: X<br>ML1_2: ◯ | match<br>ML1_1: X<br>ML1_2: ◯ | match<br>ML1_1: X<br>ML1_2: ◯ | match<br>ML1_1: X<br>ML1_2: ◯ |

As shown in in the above table, when the storage data is "00" while the search data is "00", the voltage on the first match line ML1_1 is kept while the second match line ML1_2 is discharged which represents the search result is match; and the storage data is "00" while the search data is "01", both the first match line ML1_1 and the second match line ML1_2 are discharged which represents the search result is mismatch. When the storage data is "XX", no matter the search data is "00", "01" "10" or "11" the voltage on the first match line ML1_1 is kept while the second match line ML1_2 is discharged which represents the search result is match. When the search data is "WC", no matter the storage data is "00", "01" "10" or "11", the voltage on the first match line ML1_1 is kept while the second match line ML1_2 is discharged which represents the search result is match.

Still further, in the second embodiment of the application, the first threshold voltage, the second threshold voltage, the first search voltage and the second search voltage may have different setting. For example but not limited by, in one variation example of the second embodiment, the first threshold voltage, the second threshold voltage, the first search voltage and the second search voltage may have setting as follows and the details are omitted here.

| Storage data | 00 | 01 | 10 | 11 | XX |
|---|---|---|---|---|---|
| VT_T1 | VT4 | VT3 | VT2 | VT1 | VT4 |
| VT_T2 | VT3 | VT2 | VT1 | VT0 | VT0 |
| Search data | 00 | 01 | 10 | 11 | WC |
| SL1_1 | VS4 | VS3 | VS2 | VS1 | VS1 |
| SL1_2 | VS4 | VS3 | VS2 | VS1 | VS4 |

In the second embodiment of the application, the threshold voltage (i.e. the first threshold voltage) of the first transistor T1 is higher than the threshold voltage (i.e. the second threshold voltage) of the second transistor T2; and the first search voltage (i.e. the search voltage applied to the first search line SL1_1) is the same as the second search voltage (i.e. the search voltage applied to the second search line SL1_2); when the search data is a first predetermined search data (i.e. "00" or "11"), the first and the second search voltages are both a minimum search voltage; and when the search data is a second predetermined search data (i.e. "11" or "00"), the first and the second search voltages are both a maximum search voltage. Further, when the search data is a third predetermined search data (i.e. "WC"), one of the first and the second search voltages is a minimum search voltage while another of the first and the second search voltages is a maximum search voltage.

Further, in the second embodiment of the application, when the storage data is a first predetermined storage data (i.e. "00"), the second threshold voltage is a minimum threshold voltage and the first threshold voltages is higher than the second threshold voltage; and when the storage data is a second predetermined storage data (i.e. "11"), the first threshold voltage is a maximum threshold voltage and the first threshold voltages is higher than the second threshold voltage.

Third Embodiment

Figure 3:
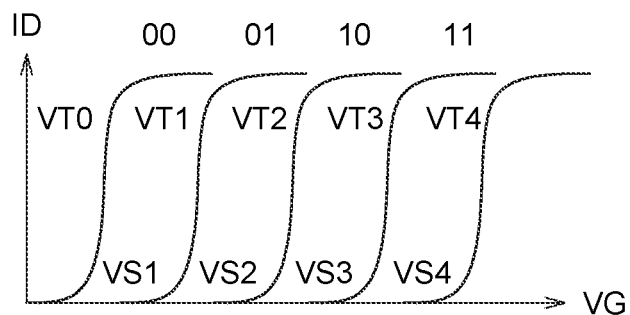
FIG. 3 shows a CAM cell and operations thereof according to a third embodiment of the application.
Figure 3:
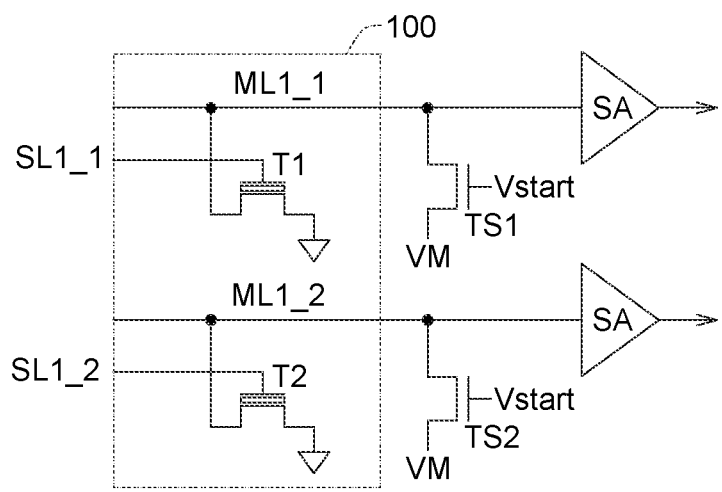

FIG. 3 shows a CAM cell and operations thereof according to a third embodiment of the application. Difference between the third embodiment and the first embodiment is described.

The following table shows the search voltages, the threshold voltages and the search results according to the third embodiment of the application.

| Search data | 00 | 01 | 10 | 11 | WC |
|---|---|---|---|---|---|
| SL1_1 | VS1 | VS2 | VS3 | VS4 | VS4 |
| SL1_2 | VS1 | VS2 | VS3 | VS4 | VS1 |
| Storage data | 00 | 01 | 10 | 11 | XX |
| VT_T1 | VT0 | VT1 | VT2 | VT3 | VT0 |
| VT_T2 | VT1 | VT2 | VT3 | VT4 | VT4 |
| Search data | 00 | 01 | 10 | 11 | |
| ML1_1 | ○ | ○ | X | X | |
| ML1_2 | ○ | X | X | X | |

(Storage data: 01) (X: keep potential; ○: discharge)

In the third embodiment of the application, when threshold voltages VT_T1 and VT_T2 of the transistors T1 and T2 are VT0 and VT1, respectively, storage data of the CAM cell 100 is "00"; when threshold voltages VT_T1 and VT_T2 of the transistors T1 and T2 are VT1 and VT2, respectively, storage data of the CAM cell 100 is "01"; when threshold voltages VT_T1 and VT_T2 of the transistors T1 and T2 are VT2 and VT3, respectively, storage data of the CAM cell 100 is "10"; and when threshold voltages VT_T1 and VT_T2 of the transistors T1 and T2 are VT3 and VT4, respectively, storage data of the CAM cell 100 is "11". Further, when threshold voltages VT_T1 and VT_T2 of the transistors T1 and T2 are VT0 and VT4, respectively, storage data of the CAM cell 100 is "XX" (don't care).

In searching in the third embodiment, when search voltages applied to the first search line SL1_1 and the second search line SL1_2 are both VS1, search data is "00"; when search voltages applied to the first search line SL1_1 and the second search line SL1_2 are both VS2, search data is "01"; when search voltages applied to the first search line SL1_1 and the second search line SL1_2 are both VS3, search data is "10"; when search voltages applied to the first search line SL1_1 and the second search line SL1_2 are both VS4, search data is "11"; and when search voltages applied to the first search line SL1_1 and the second search line SL1_2 are VS4 and VS1, respectively, search data is "WC (wildcard)".

In the third embodiment of the application, values of the threshold voltages VT0, VT1, VT2, VT3 and VT4 are for example but not limited by, 0V, 1V, 2V, 3V and 4V; and values of the search voltages VS1, VS2, VS3 and VS4 are for example but not limited by, 0.5V, 1.5V, 2.5V and 3.5V.

Search operations in the third embodiment are described in the following by the case that the storage data of the CAM cell 100 is "01" wherein the threshold voltages VT_V1 and VT_T2 of the transistors T1 and T2 are VT1 and VT2, respectively). When the search data is "00" (the search voltages applied to the first search line SL1_1 and the second search line SL1_2 are both VS1 (0.5V)), the threshold voltage VT_T1 of the transistor T1 is VT1 (1V) while the search voltage applied to the first search line SL1_1 is VS1 (0.5V), and thus, the transistor T1 is turned on to discharge the first match line ML1_1; and the threshold voltage VT_T2 of the transistor T2 is VT2 (2V) while the search voltage applied to the second search line SL1_2 is VS1 (0.5V), and thus, the transistor T2 is turned on to discharge the second match line ML1_2. Similarly, when the search data is "01" (the search voltages applied to the first search line SL1_1 and the second search line SL1_2 are both VS2 (1.5V)), the threshold voltage VT_T1 of the transistor T1 is VT1 (1V) while the search voltage applied to the first search line is VS2 (1.5V), and thus, the transistor T1 is turned on to discharge the first match line ML1_1; and the threshold voltage VT_T2 of the transistor T2 is VT2 (2V) while the search voltage applied to the second search line SL1_2 is VS2 (1.5V), and thus, the transistor T2 is turned off to keep potential of the second match line ML1_2. Similarly, when the search data is "10" (the search voltages applied to the first search line SL1_1 and the second search line SL1_2 are both VS3 (2.5V)), the threshold voltage VT_T1 of the transistor T1 is VT1 (1V) while the search voltage applied to the first search line SL1_1 is VS3 (2.5V), and thus, the transistor T1 is turned off to keep potential of the first match line ML1_1; and the threshold voltage VT_T2 of the transistor T2 is VT2 (2V) while the search voltage applied to the second search line SL1_2 is VS3 (2.5V), and thus, the transistor T2 is turned off to keep potential of the second match line ML1_2. Similarly, when the search data is "11" (the search voltages applied to the first search line SL1_1 and the second search line SL1_2 are both VS4 (3.5V)), the threshold voltage VT_T1 of the transistor T1 is VT1 (1V) while the search voltage applied to the first search line SL1_1 is VS4 (3.5V), and thus, the transistor T1 is turned off to keep potential of the first match line ML1_1; and the threshold voltage VT_T2 of the transistor T2 is VT2 (2V) while the search voltage applied to the second search line SL1_2 is VS4 (3.5V), and thus, the transistor T2 is turned off to keep potential of the second match line ML1_2.

Thus, in the third embodiment of the application, when the first match line ML1_1 is discharged while the voltage on the second match line ML1_2 is kept, the storage data is matched with the search data; when the voltage on the first match line ML1_1 is kept while the voltage on the second match line ML1_2 is kept, the storage data is mismatched with the search data; and when both the first match line ML1_1 and the second match line ML1_2 are discharged, the storage data is mismatched with the search data.

The following table shows a search table according to the third embodiment of the application.

| | | Storage data 00 | Storage data 01 | Storage data 10 | Storage data 11 | Storage data XX |
|---|---|---|---|---|---|---|
| Search data 00 | | match<br>ML1_1: ○<br>ML1_2: X | mismatch<br>ML1_1: X<br>ML1_2: X | mismatch<br>ML1_1: X<br>ML1_2: X | mismatch<br>ML1_1: X<br>ML1_2: X | match<br>ML1_1: ○<br>ML1_2: X |

|  | Storage data 00 | Storage data 01 | Storage data 10 | Storage data 11 | Storage data XX |
|---|---|---|---|---|---|
| Search data 01 | mismatch ML1_1: ○ ML1_2: ○ | match ML1_1: ○ ML1_2: X | mismatch ML1_1: X ML1_2: X | mismatch ML1_1: X ML1_2: X | match ML1_1: ○ ML1_2: X |
| Search data 10 | mismatch ML1_1: ○ ML1_2: ○ | mismatch ML1_1: ○ ML1_2: ○ | match ML1_1: ○ ML1_2: X | mismatch ML1_1: X ML1_2: X | match ML1_1: ○ ML1_2: X |
| Search data 11 | mismatch ML1_1: ○ ML1_2: ○ | mismatch ML1_1: ○ ML1_2: ○ | mismatch ML1_1: ○ ML1_2: ○ | match ML1_1: ○ ML1_2: X | match ML1_1: ○ ML1_2: X |
| Search data WC | match ML1_1: ○ ML1_2: X | match ML1_1: ○ ML1_2: X | match ML1_1: ○ ML1_2: X | match ML1_1: ○ ML1_2: X | match ML1_1: ○ ML1_2: X |

As shown in in the above table, when the storage data is "00" while the search data is "00" the first match line ML1_1 is discharged while the voltage on the second match line ML1_2 is kept which represents the search result is match; and when the storage data is "00" while the search data is "01" both the first match line ML1_1 and the second match line ML1_2 are discharged which represents the search result is mismatch. When the storage data is "XX", no matter the search data is "00", "01" "10" or "11", the first match line ML1_1 is discharged while the voltage on the second match line ML1_2 is kept which represents the search result is match. When the search data is "WC", no matter the storage data is "00", "01", "10" or "11", the first match line ML1_1 is discharged while the voltage on the second match line ML1_2 is kept which represents the search result is match.

In the third embodiment of the application, the threshold voltage (i.e. the first threshold voltage) of the first transistor T1 is lower than the threshold voltage (i.e. the second threshold voltage) of the second transistor T2; and the first search voltage (i.e. the search voltage applied to the first search line SL1_1) is the same as the second search voltage (i.e. the search voltage applied to the second search line SL1_2); when the search data is a first predetermined search data (i.e. "00"), the first and the second search voltages are both a minimum search voltage; and when the search data is a second predetermined search data (i.e. "11"), the first and the second search voltages are both a maximum search voltage.

Further, in the third embodiment of the application, when the storage data is a first predetermined storage data (i.e. "00"), the first threshold voltage is a minimum threshold voltage and the second threshold voltages is higher than the first threshold voltage; and when the storage data is a second predetermined storage data (i.e. "11"), the second threshold voltage is a maximum threshold voltage and the second threshold voltages is higher than the first threshold voltage.

In the first embodiment to the third embodiment, the parallel-coupled flash memory cells have the same threshold voltages, or a threshold voltage of the parallel-coupled flash memory cells is higher than another threshold voltage of the parallel-coupled flash memory cells.

Fourth Embodiment

Figure 4A:
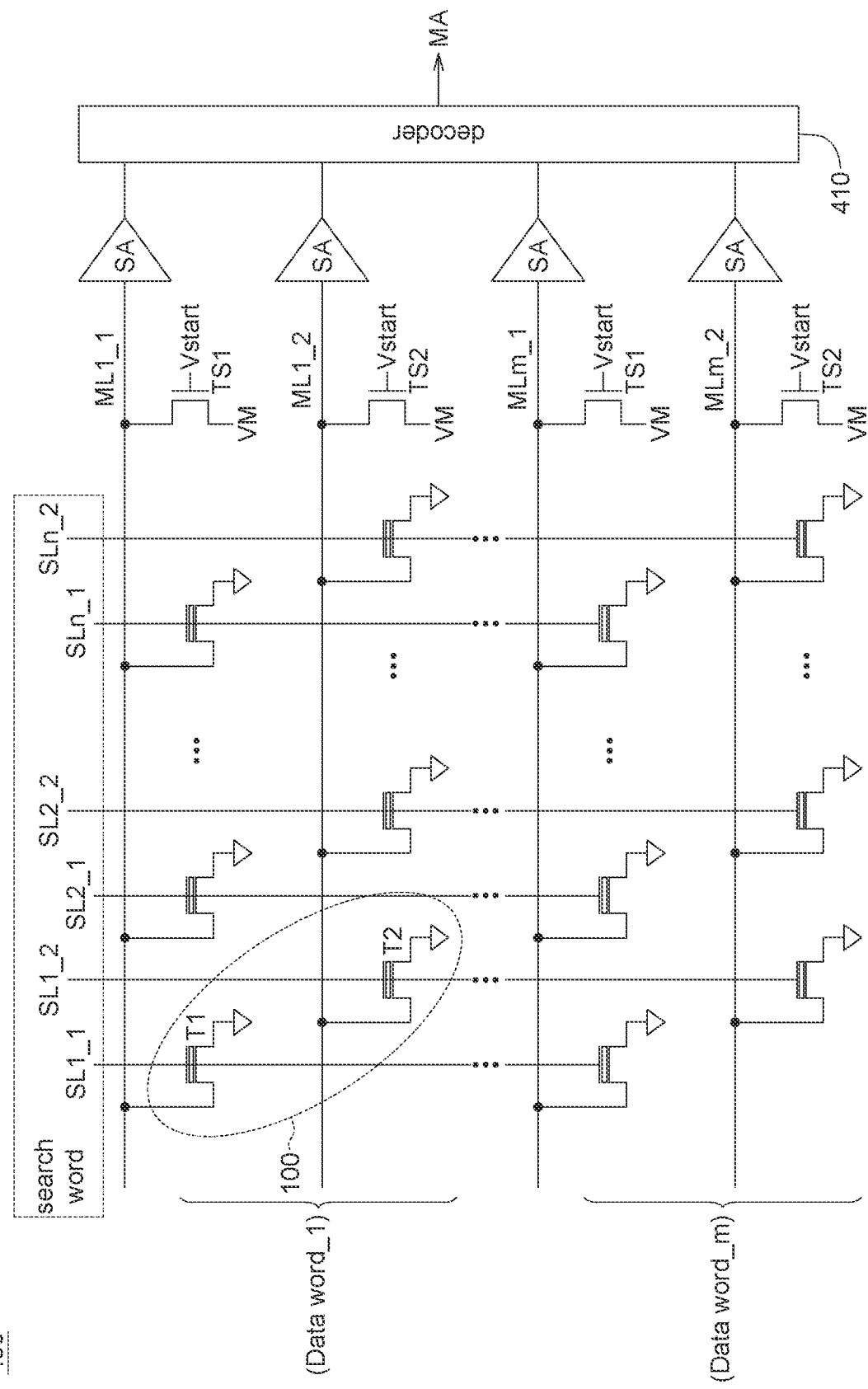
FIG. 4A shows a circuit diagram of a CAM memory device according to a fourth embodiment of the application.
Figure 4B:
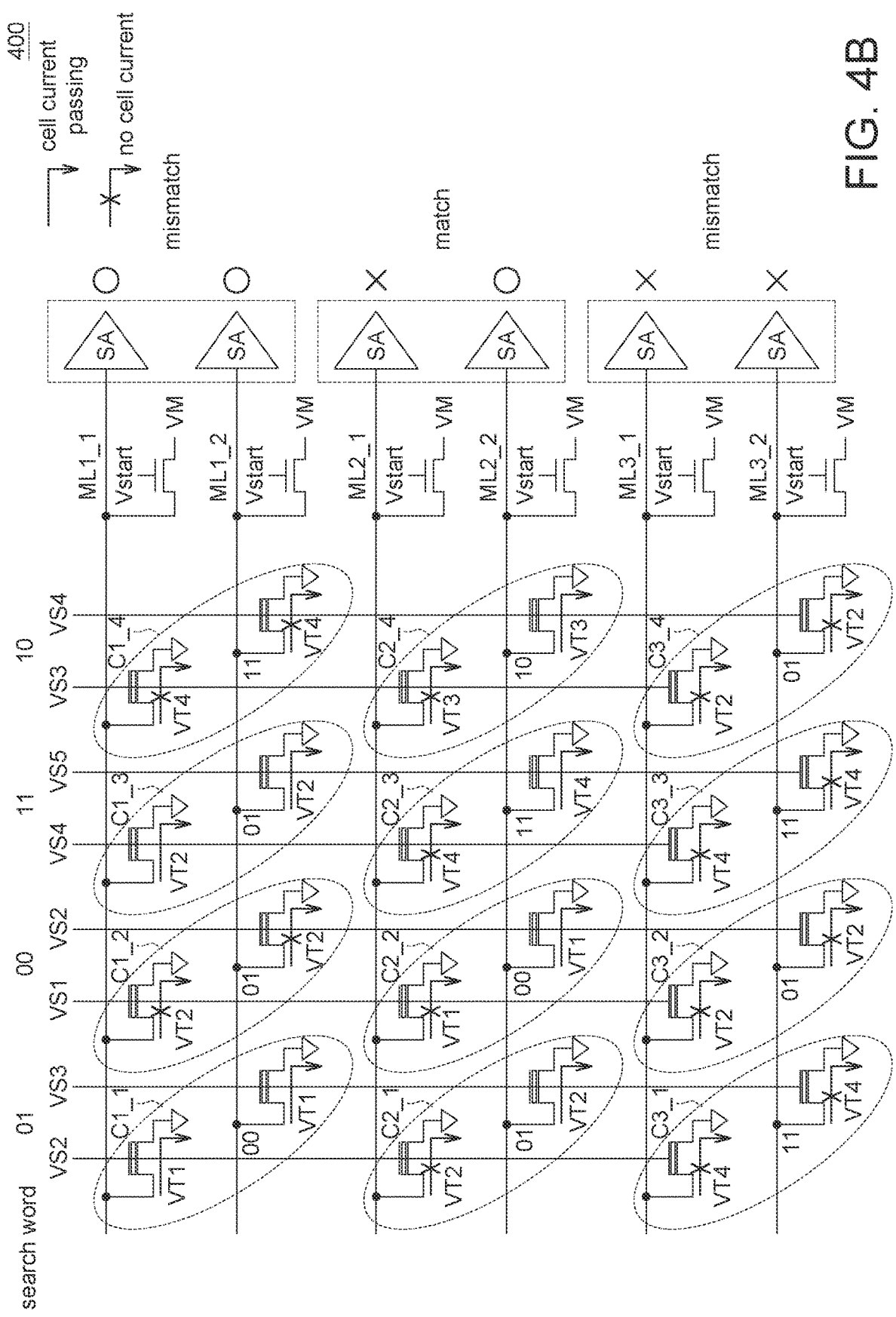
FIG. 4B shows operations of the CAM memory device according to the fourth embodiment of the application.

FIG. 4A shows a circuit diagram of a CAM memory device according to a fourth embodiment of the application. FIG. 4B shows operations of the CAM memory device according to the fourth embodiment of the application.

As shown in FIG. 4A, the CAM memory device 400 according to the fourth embodiment includes a plurality of CAM cells 100, a plurality of match lines ML1_1-MLm_2 (m being a positive integer), a plurality of search lines SL1_1-SLn_2 (n being a positive integer), a plurality of sensing amplifiers SA, a plurality of start transistors TS1, TS2 and a decoder 410. The CAM cells 100 may be the same or similar to those in the first to the third embodiments. In the fourth embodiment, the threshold voltage setting of the CAM cell 100 may be the same or similar to those in the first to the third embodiments; and the search voltage setting on the search lines may be the same or similar to those in the first to the third embodiments. Details are omitted here.

The CAM cells 100 are arranged in an array. Data stored in the 2 n CAM cells coupled to the match lines ML1_1 and ML1_2 form a data word (Data word_1). When any one transistor coupled to the same match line is turned on, the match line is discharged; and when all the transistors coupled to the same match line are turned off, potential of the match line is kept.

The CAM cells are searched and compared with the search word via the search lines SL1_1-SLn_2. As shown in FIG. 4A, a search word includes 2 n bits and each bit of the search word searches and compares one of the CAM cells 100 via a search line.

The decoder 410 is coupled to the sensing amplifiers SA. Based on sensing results from the sensing amplifiers SA, the decoder 410 generates a match address MA which indicates the respective addresses of the matched CAM cells having matched search results.

In FIG. 4A, the search word includes a plurality of search data; and the data word includes a plurality of storage data stored in a plurality of CAM cells 100.

Refer to FIG. 4B to explain operations in the fourth embodiment. The threshold voltage settings and the search voltage settings are same as the first embodiment. The case in which the search word is [01001110], the first data word (Data word 1) is [00010111], the second data word (Data word 2) is [01001110] and the third data word (Data word 3) is [11011101] is taken as an example, but the application is not limited by this.

When the first data word [00010111] is searched by the search word [01001110], the two transistors of the CAM cell C1_1 are both turned on; the two transistors of the CAM cell C1_2 are both turned off; the two transistors of the CAM cell C1_3 are both turned on; and the two transistors of the CAM cell C1_4 are both turned off. Thus, the match line ML1_1 is discharged and the match line ML1_2 is also discharged. Thus, when the first data word [00010111] is searched by the search word [01001110], the search result is mismatch.

Similarly, when the second data word [01001110] is searched by the search word [01001110], the transistors T1 and T2 of the CAM cell C2_1 are turned off and turned on, respectively; the transistors T1 and T2 of the CAM cell C2_2 are turned off and turned on, respectively; the transistors T1 and T2 of the CAM cell C2_3 are turned off and turned on, respectively; and the transistors T1 and T2 of the CAM cell C2_4 are turned off and turned on, respectively. Thus, potential of the match line ML2_1 is kept and the match line ML2_2 is discharged. Thus, when the second data word [01001110] is searched by the search word [01001110], the search result is match.

Similarly, when the third data word [11011101] is searched by the search word [01001110], the search result is mismatch.

Fifth Embodiment

Figure 5A:
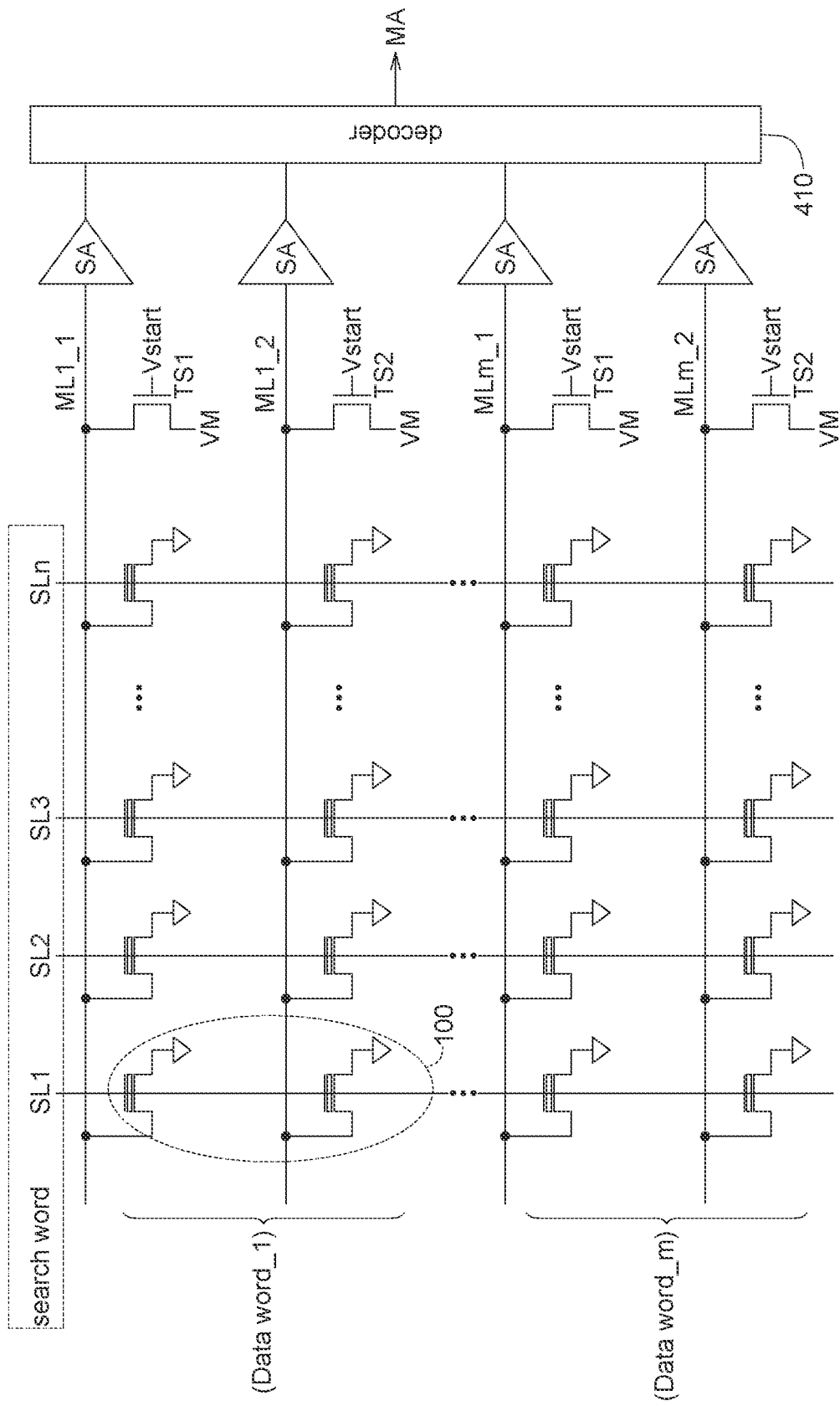
FIG. 5A shows a circuit diagram of a CAM memory device according to a fifth embodiment of the application.
Figure 5B:
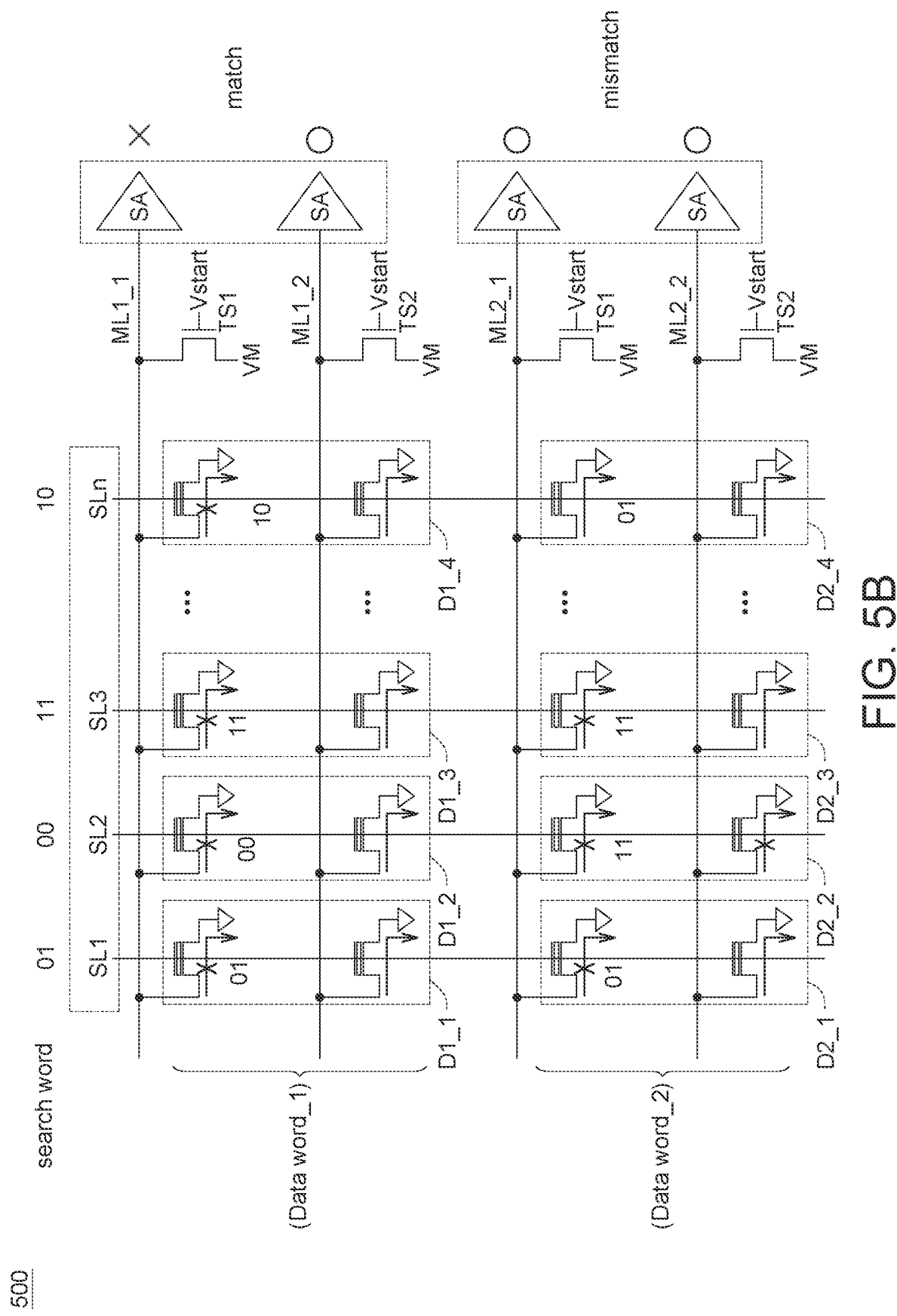
FIG. 5B shows operations of the CAM memory device according to the fifth embodiment of the application.

FIG. 5A shows a circuit diagram of a CAM memory device according to a fifth embodiment of the application. FIG. 5B shows operations of the CAM memory device according to the fifth embodiment of the application.

As shown in FIG. 5A, the CAM memory device 500 in the fifth embodiment includes a plurality of CAM cells 100, a plurality of match lines ML1_1-MLm_2 (m being a positive integer), a plurality of search lines SL1-SLn (n being a positive integer), a plurality of sensing amplifiers SA, a plurality of start transistors TS1, TS2 and a decoder 410. The CAM cells 100 may be the same or similar to those in the first to the third embodiments. In the fifth embodiment, the threshold voltage setting of the CAM cell 100 may be the same or similar to those in the second to the third embodiments; and the search voltage setting on the search lines may be the same or similar to those in the second to the third embodiments. Details are omitted here. In the fifth embodiment, the two flash memory cells of each CAM cell 100 share the same search line. On the contrary, in the first to the fourth embodiments, the two flash memory cells of each CAM cell 100 are coupled to two search lines. Thus, compared with the fourth embodiment, the CAM memory device 500 of the fifth embodiment has higher memory density.

Refer to FIG. 5B to explain operations in the fifth embodiment. The threshold voltage settings and the search voltage settings are same as the second embodiment. The case in which the search word is [01001110], the first data word (Data word 1) is [01001110] and the second data word (Data word 2) is [01111101] is taken as an example, but the application is not limited by this.

When the first data word [01001110] is searched by the search word [01001110], the transistors T1 and T2 of the CAM cell D1_1 are turned off and turned on, respectively; the transistors T1 and T2 of the CAM cell D1_2 are turned off and turned on, respectively; the transistors T1 and T2 of the CAM cell D1_3 are turned off and turned on, respectively; and the transistors T1 and T2 of the CAM cell D1_4 are turned off and turned on, respectively. Thus, potential of the match line ML1_1 is kept and the match line ML1_2 is discharged. Thus, when the first data word [01001110] is searched by the search word [01001110], the search result is match.

Similarly, when the second data word [01111101] is searched by the search word [01001110], both the match lines ML2_1 and ML2_2 are discharged and the search result is mismatch.

Sixth Embodiment

Figure 6:
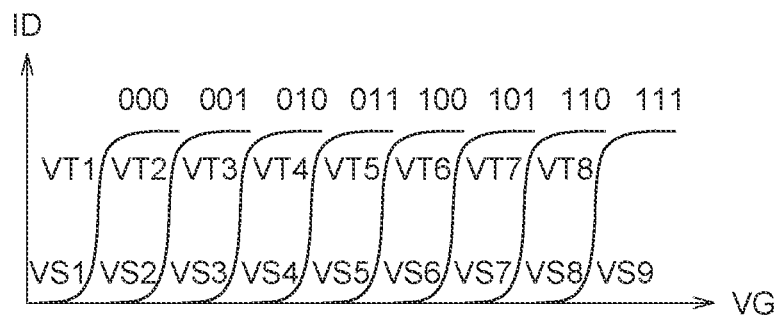
FIG. 6 shows a CAM cell and operations thereof according to a sixth embodiment of the application.
Figure 6:
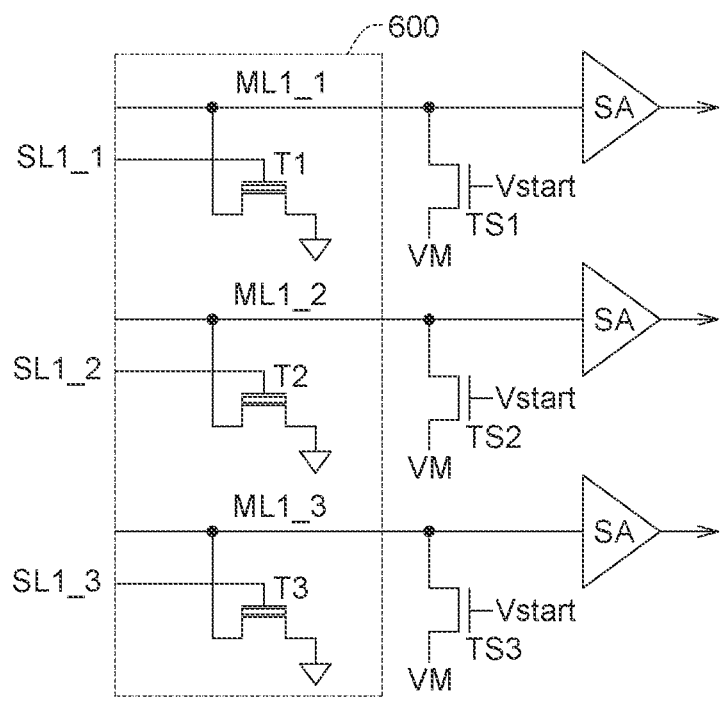

FIG. 6 shows a CAM cell and operations thereof according to a sixth embodiment of the application. As shown in FIG. 6, the CAM cell 600 according to the fifth embodiment of the application is for example but not limited by, a triple-level CAM cell storing three bits in one single cell.

The CAM cell 600 includes a plurality of parallel-coupled flash memory cell (for example, two transistors T1, T2 and T3).

Three terminals of the transistor T1 are coupled to a first search line SL1_1, a first match line ML1_1 and ground (GND), respectively. Similarly, three terminals of the transistor T2 are coupled to a second search line SL1_2, a second match line ML1_2 and ground (GND), respectively. Three terminals of the transistor T3 are coupled to a third search line SL1_3, a third match line ML1_3 and ground (GND), respectively.

Besides, the transistors T1, T2 and T3 are further coupled to starting transistors TS1, TS2 and TS3, respectively. Three terminals of the transistor TS1 are coupled to the first match line ML1_1, a start voltage Tstart and a charge voltage VM, respectively. Similarly, three terminals of the transistor TS2 are coupled to the second match line ML1_2, the start voltage Tstart and the charge voltage VM, respectively. Three terminals of the transistor TS3 are coupled to the third match line ML1_3, the start voltage Tstart and the charge voltage VM, respectively.

The following table shows the search voltages, the threshold voltages and the search results according to the first embodiment of the application.

| Search data | 000 | 001 | 010 | 011 | 100 | 101 | 110 | 111 | WC |
|---|---|---|---|---|---|---|---|---|---|
| SL1_1 | VS1 | VS2 | VS3 | VS4 | VS5 | VS6 | VS7 | VS8 | VS1 |
| SL1_2 | VS2 | VS3 | VS4 | VS5 | VS6 | VS7 | VS8 | VS9 | VS9 |
| SL1_3 | VS3 | VS4 | VS5 | VS6 | VS7 | VS8 | VS9 | VS9 | VS9 |
| Storage data | 000 | 001 | 010 | 011 | 100 | 101 | 110 | 111 | WC |
| VT_T1 | VT1 | VT2 | VT3 | VT4 | VT5 | VT6 | VT7 | VT8 | VT8 |
| VT_T2 | VT1 | VT2 | VT3 | VT4 | VT5 | VT6 | VT7 | VT8 | VT1 |
| VT_T3 | VT1 | VT2 | VT3 | VT4 | VT5 | VT6 | VT7 | VT8 | VT1 |
| Search data | 000 | 001 | 010 | 011 | 100 | 101 | 110 | 111 | |
| ML1_1 | X | X | X | ○ | ○ | ○ | ○ | ○ | |
| ML1_2 | X | X | ○ | ○ | ○ | ○ | ○ | ○ | |
| ML1_3 | X | ○ | ○ | ○ | ○ | ○ | ○ | ○ | |

(Storage data: 010) (X: keep potential; ○: discharge)

In the sixth embodiment of the application, when threshold voltages VT_T1, VT_T2 and VT_T3 of the transistors T1-T3 are all VT1, storage data of the CAM cell 100 is "000"; when threshold voltages VT_T1, VT_T2 and VT_T3 of the transistors T1-T3 are all VT2, storage data of the CAM cell 600 is "001"; when threshold voltages VT_T 1, VT_T2 and VT_T3 of the transistors T1-T3 are all VT3, storage data of the CAM cell 600 is "010"; when threshold voltages VT_T1, VT_T2 and VT_T3 of the transistors T1-T3 are all VT4, storage data of the CAM cell 600 is "011"; when threshold voltages VT_T1, VT_T2 and VT_T3 of the transistors T1-T3 are all VT5, storage data of the CAM cell 600 is "100"; when threshold voltages VT_T1, VT_T2 and VT_T3 of the transistors T1-T3 are all VT6, storage data of the CAM cell 100 is "101"; when threshold voltages VT_T1, VT_T2 and VT_T3 of the transistors T1-T3 are all VT7, storage data of the CAM cell 600 is "110"; and when threshold voltages VT_T1 VT_T2 and VT_T3 of the transistors T1-T3 are all VT8, storage data of the CAM cell 600 is "111". Further, when threshold voltages VT_T1, VT_T2 and VT_T3 of the transistors T1-T3 are VT8, VT1 and VT1, respectively, storage data of the CAM cell 100 is "XXX" (don't care).

In searching, when search voltages applied to the first search line SL1_1, the second search line and the third search line SL1_3 are VS1 VS2 and VS3, respectively, search data is "000"; when search voltages applied to the first search line SL1_1, the second search line SL1_2 and the third search line SL1_3 are VS2, VS3 and VS4, respectively, search data is "001"; when search voltages applied to the first search line SL1_1, the second search line SL1_2 and the third search line SL1_3 are VS3, VS4 and VS5, respectively, search data is "010"; when search voltages applied to the first search line SL1_1, the second search line SL1_2 and the third search line SL1_3 are VS4, VS5 and VS6, respectively, search data is "011"; when search voltages applied to the first search line SL1_1, the second search line SL1_2 and the third search line SL1_3 are VS5, VS6 and VS7, respectively, search data is "100"; when search voltages applied to the first search line SL1_1, the second search line SL1_2 and the third search line SL1_3 are VS6, VS7 and VS8, respectively, search data is "101"; when search voltages applied to the first search line SL1_1, the second search line SL1_2 and the third search line SL1_3 are VS7, VS8 and VS9 respectively, search data is "110"; when search voltages applied to the first search line SL1_1, the second search line SL1_2 and the third search line SL1_3 are VS8, VS9 and VS9, respectively, search data is "111"; and when search voltages applied to the first search line SL1_1, the second search line SL1_2 and the third search line SL1_3 are VS1, VS9 and VS9, respectively, search data is "WC".

In the sixth embodiment of the application, the threshold voltages VT1, VT2, VT3, VT4, VT5, VT6, VT7 and VT8 are for example but not limited by, 1V, 2V, 3V, 4V, 5V, 6V, 7V and 8V; and the search voltages VS1, VS2, VS3, VS4, VS5, VS6, VS7, VS8 and VS9 are for example but not limited by 0.5V, 1.5V, 2.5V, 3.5V, 4.5V, 5.5V, 6.5V, 7.5V and 8.5V.

When the storage data of the CAM cell 600 is "010" and the search data is "010", potential of the first match line ML1_1 is kept; the second match line ML1_2 and the third match line ML1_3 are discharged, which refers to that the search result is matched and so on.

Thus, in the sixth embodiment of the application, when the voltage on the first match line ML1_1 is kept while the second match line ML1_2 and the third match line ML1_3 are discharged, the storage data is matched with the search data; when the voltages on the first match line ML1_1 and the second match line ML1_2 are kept while the third match line ML1_3 is discharged, the storage data is mismatched with the search data; when the voltages on the first match line ML1_1 to the third match line ML1_3 are all kept, the storage data is mismatched with the search data; and the first match line ML1_1 to the third match line ML1_3 are all discharged, the storage data is mismatched with the search data.

The following table shows a search table according to the sixth embodiment of the application.

|  | Storage data 000 | Storage data 001 | Storage data 010 | Storage data 011 |
|---|---|---|---|---|
| Search data 000 | match<br>ML1_1: X<br>ML1_2: ○<br>ML1_3: ○ | mismatch<br>ML1_1: X<br>ML1_2: X<br>ML1_3: ○ | mismatch<br>ML1_1: X<br>ML1_2: X<br>ML1_3: X | mismatch<br>ML1_1: X<br>ML1_2: X<br>ML1_3: X |
| Search data 001 | mismatch<br>ML1_1: ○<br>ML1_2: ○<br>ML1_3: ○ | match<br>ML1_1: X<br>ML1_2: ○<br>ML1_3: ○ | mismatch<br>ML1_1: X<br>ML1_2: X<br>ML1_3: ○ | mismatch<br>ML1_1: X<br>ML1_2: X<br>ML1_3: X |
| Search data 010 | mismatch<br>ML1_1: ○<br>ML1_2: ○<br>ML1_3: ○ | mismatch<br>ML1_1: ○<br>ML1_2: ○<br>ML1_3: ○ | match<br>ML1_1: X<br>ML1_2: ○<br>ML1_3: ○ | mismatch<br>ML1_1: X<br>ML1_2: X<br>ML1_3: ○ |
| Search data 011 | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: ○ | match<br>ML1_1: X<br>ML1_2: ○<br>ML1_3: ○ |
| Search data 100 | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: ○ |
| Search data 101 | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: ○ |
| Search data 110 | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: ○ |

-continued

| | | | | |
|---|---|---|---|---|
| Search data 111 | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: ○ |
| Search data WC | match<br>ML1_1: X<br>ML1_2: ○<br>ML1_3: ○ | match<br>ML1_1: X<br>ML1_2: ○<br>ML1_3: ○ | match<br>ML1_1: X<br>ML1_2: ○<br>ML1_3: ○ | match<br>ML1_1: X<br>ML1_2: ○<br>ML1_3: ○ |

| | Storage data 100 | Storage data 101 | Storage data 110 | Storage data 111 | Storage data XXX |
|---|---|---|---|---|---|
| Search data 000 | mismatch<br>ML1_1: X<br>ML1_2: X<br>ML1_3: X | mismatch<br>ML1_1: X<br>ML1_2: X<br>ML1_3: X | mismatch<br>ML1_1: X<br>ML1_2: X<br>ML1_3: X | mismatch<br>ML1_1: X<br>ML1_2: X<br>ML1_3: X | match<br>ML1_1: X<br>ML1_2: ○<br>ML1_3: ○ |
| Search data 001 | mismatch<br>ML1_1: X<br>ML1_2: X<br>ML1_3: X | mismatch<br>ML1_1: X<br>ML1_2: X<br>ML1_3: X | mismatch<br>ML1_1: X<br>ML1_2: X<br>ML1_3: X | mismatch<br>ML1_1: X<br>ML1_2: X<br>ML1_3: X | match<br>ML1_1: X<br>ML1_2: ○<br>ML1_3: ○ |
| Search data 010 | mismatch<br>ML1_1: X<br>ML1_2: X<br>ML1_3: X | mismatch<br>ML1_1: X<br>ML1_2: X<br>ML1_3: X | mismatch<br>ML1_1: X<br>ML1_2: X<br>ML1_3: X | mismatch<br>ML1_1: X<br>ML1_2: X<br>ML1_3: X | match<br>ML1_1: X<br>ML1_2: ○<br>ML1_3: ○ |
| Search data 011 | mismatch<br>ML1_1: X<br>ML1_2: X<br>ML1_3: ○ | mismatch<br>ML1_1: X<br>ML1_2: X<br>ML1_3: X | mismatch<br>ML1_1: X<br>ML1_2: X<br>ML1_3: X | mismatch<br>ML1_1: X<br>ML1_2: X<br>ML1_3: X | match<br>ML1_1: X<br>ML1_2: ○<br>ML1_3: ○ |
| Search data 100 | mismatch<br>ML1_1: X<br>ML1_2: ○<br>ML1_3: ○ | mismatch<br>ML1_1: X<br>ML1_2: X<br>ML1_3: ○ | mismatch<br>ML1_1: X<br>ML1_2: X<br>ML1_3: X | mismatch<br>ML1_1: X<br>ML1_2: X<br>ML1_3: X | match<br>ML1_1: X<br>ML1_2: ○<br>ML1_3: ○ |
| Search data 101 | mismatch<br>ML1_1: ○<br>ML1_2: ○<br>ML1_3: ○ | mismatch<br>ML1_1: X<br>ML1_2: ○<br>ML1_3: ○ | mismatch<br>ML1_1: X<br>ML1_2: X<br>ML1_3: ○ | mismatch<br>ML1_1: X<br>ML1_2: X<br>ML1_3: X | match<br>ML1_1: X<br>ML1_2: ○<br>ML1_3: ○ |
| Search data 110 | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: X<br>ML1_2: ○<br>ML1_3: ○ | match<br>ML1_1: X<br>ML1_2: ○<br>ML1_3: ○ |
| Search data 111 | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: X<br>ML1_2: ○<br>ML1_3: ○ | match<br>ML1_1: X<br>ML1_2: ○<br>ML1_3: ○ |
| Search data WC | match<br>ML1_1: X<br>ML1_2: ○<br>ML1_3: ○ | match<br>ML1_1: X<br>ML1_2: ○<br>ML1_3: ○ | match<br>ML1_1: X<br>ML1_2: ○<br>ML1_3: ○ | match<br>ML1_1: X<br>ML1_2: ○<br>ML1_3: ○ | match<br>ML1_1: X<br>ML1_2: ○<br>ML1_3: ○ |

As shown in the above table, when the storage data is "000" while the search data is "000", the voltage on the first match line ML1_1 is kept while the second match line ML1_2 and the third match line ML1_3 are discharged which represents the search result is match; and when the storage data is "000" while the search data is "001", the first match line ML1_1 to the third match line ML1_3 are all discharged which represents the search result is mismatch. When the storage data is "XX", no matter the value of the search data, the search result is match. When the search data is "WC", no matter the value of the storage data, the search result is match.

In the sixth embodiment of the application, the threshold voltage (i.e. a first threshold voltage) of the first transistor T1 is the same as the threshold voltage (i.e. a second threshold voltage) of the second transistor T2 and the threshold voltage (i.e. a third threshold voltage) of the third transistor T3; the first search voltage (i.e. the search voltage applied to the first search line SL1_1) is lower than the second search voltage (i.e. the search voltage applied to the second search line SL1_2): the second search voltage is lower than the third search voltage (i.e. the search voltage applied to the third search line SL1_3); when the storage data is a first predetermined storage data (i.e. "000"), the first, the second and the third threshold voltages are a minimum threshold voltage; and when the storage data is a second predetermined storage data (i.e. "111"), the first, the second and the third threshold voltages are a maximum threshold voltage.

Seventh Embodiment

Figure 7:
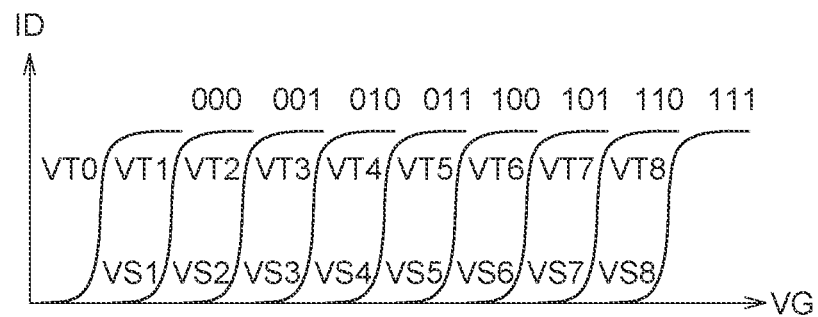
FIG. 7 shows a CAM cell and operations thereof according to a seventh embodiment of the application.
Figure 7:
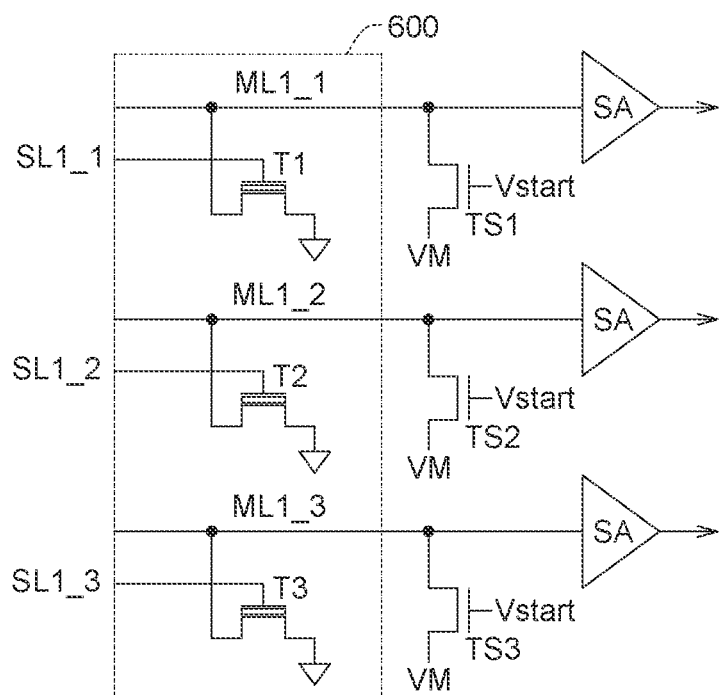

FIG. 7 shows a CAM cell and operations thereof according to a seventh embodiment of the application.

The following table shows the search voltages, the threshold voltages and the search results according to the first embodiment of the application.

| Search data | 000 | 001 | 010 | 011 | 100 | 101 | 110 | 111 | WC |
|---|---|---|---|---|---|---|---|---|---|
| SL1_1 | VS1 | VS2 | VS3 | VS4 | VS5 | VS6 | VS7 | VS8 | VS1 |
| SL1_2 | VS1 | VS2 | VS3 | VS4 | VS5 | VS6 | VS7 | VS8 | VS8 |
| SL1_3 | VS1 | VS2 | VS3 | VS4 | VS5 | VS6 | VS7 | VS8 | VS8 |

| Storage data | 000 | 001 | 010 | 011 | 100 | 101 | 110 | 111 | WC |
|---|---|---|---|---|---|---|---|---|---|
| VT_T1 | VT1 | VT2 | VT3 | VT4 | VT5 | VT6 | VT7 | VT8 | VT8 |
| VT_T2 | VT0 | VT1 | VT2 | VT3 | VT4 | VT5 | VT6 | VT7 | VT1 |
| VT_T3 | VT0 | VT0 | VT1 | VT2 | VT3 | VT4 | VT5 | VT6 | VT1 |

| Search data | 000 | 001 | 010 | 011 | 100 | 101 | 110 | 111 |
|---|---|---|---|---|---|---|---|---|
| ML1_1 | X | X | X | ○ | ○ | ○ | ○ | ○ |
| ML1_2 | X | X | ○ | ○ | ○ | ○ | ○ | ○ |
| ML1_3 | X | ○ | ○ | ○ | ○ | ○ | ○ | ○ |

(Storage data: 010) (X: keep potential; ○: discharge)

In the seventh embodiment of the application, when threshold voltages VT_T1, VT_T2 and VT_T3 of the transistors T1-T3 are VT1,VT0 and VT0, respectively, storage data of the CAM cell 600 is "000"; when threshold voltages VT_T1, VT_T2 and VT_T3 of the transistors T1-T3 are VT2,VT1 and VT0, respectively, storage data of the CAM cell 600 is "001"; when threshold voltages VT_T1, VT_T2 and VT_T3 of the transistors T1-T3 are VT3, VT2 and VT1, respectively, storage data of the CAM cell 600 is "010"; when threshold voltages VT_T1, VT_T2 and VT_T3 of the transistors T1-T3 are VT4, VT3 and VT2, respectively, storage data of the CAM cell 600 is "011", when threshold voltages VT_T1, VT_T2 and VT_T3 of the transistors T1-T3 are VT5, VT4 and VT3, respectively, storage data of the CAM cell 600 is "100"; when threshold voltages VT_T1, VT_T2 and VT_T3 of the transistors T1-T3 are VT6, VT5 and VT4, respectively, storage data of the CAM cell 600 is "101"; when threshold voltages VT_T1, VT_T2 and VT_T3 of the transistors T1-T3 are VT7, VT6 and VT5, respectively, storage data of the CAM cell 600 is "110"; and when threshold voltages VT_T1, VT_T2 and VT_T3 of the transistors T1-T3 are VT8, VT7 and VT6, respectively, storage data of the CAM cell 600 is "111". Further, when threshold voltages VT_T1, VT_T2 and VT_T3 of the transistors T1-T3 are VT8, VT0 and VT0, respectively, storage data of the CAM cell 600 is "XXX" (don't care).

In searching, when search voltages applied to the first search line SL1_1, the second search line SL1_2 and the third search line SL1_3 are VS1, VS1 and VS1, respectively, search data is "000"; when search voltages applied to the first search line SL1_1, the second search line SL1_2 and the third search line SL1_3 are VS2, VS2 and VS2, respectively, search data "001"; when search voltages applied to the first search line SL1_1, the second search line SL1_2 and the third search line SL1_3 are VS3, VS3 and VS3, respectively, search data is "010"; when search voltages applied to the first search line SL1_1, the second search line SL1_2 and the third search line SL1_3 are VS4, VS4 and VS4, respectively, search data is "011"; when search voltages applied to the first search line SL1_1, the second search line SL1_2 and the third search line SL1_3 are VS5, VS5 and VS5, respectively, search data is "100"; when search voltages applied to the first search line SL1_1, the second search line SL1_2 and the third search line SL1_3 are VS6, VS6 and VS6, respectively, search data is "101"; when search voltages applied to the first search line SL1_1, the second search line SL1_2 and the third search line SL1_3 are VS7, VS7 and VS7, respectively, search data is "110"; when search voltages applied to the first search line SL1_1, the second search line SL1_2 and the third search line SL1_3 are VS8, VS8 and VS8, respectively, search data is "111"; and when search voltages applied to the first search line SL1_1, the second search line SL1_2 and the third search line SL1_3 are VS1, VS8 and VS8, respectively, search data is "WC".

In the seventh embodiment of the application, the threshold voltages VT0, VT1, VT2, VT3, VT4, VT5, VT6, VT7 and VT8 are for example but not limited by, 0V, 1V, 2V, 3V, 4V, 5V, 6V, 7V and 8V; and the search voltages VS1, VS2, VS3, VS4, VS5, VS6, VS7 and VS8 are for example but not limited by 0.5V, 1.5V, 2.5V, 3.5V, 4.5V, 5.5V, 6.5V and 7.5V.

When the storage data of the CAM cell 600 is "010" and the search data is "010", potential of the first match line ML1_1 is kept; the second match line ML1_2 and the third match line ML1_3 are discharged, which refers to that the search result is matched, and so on.

Thus, in the seventh embodiment of the application, when the voltage on the first match line ML1_1 is kept while the second match line ML1_2 and the third match line ML1_3 are discharged, the storage data is matched with the search data; when the voltages on the first match line ML1_1 and the second match line ML1_2 are kept while the third match line ML1_3 is discharged, the storage data is mismatched with the search data; when the voltages on the first match line ML1_1 to the third match line ML1_3 are all kept, the storage data is mismatched with the search data; and the first match line ML1_1 to the third match line ML1_3 are all discharged, the storage data is mismatched with the search data.

The following table shows a search table according to the seventh embodiment of the application.

| | Storage data 000 | Storage data 001 | Storage data 010 | Storage data 011 |
|---|---|---|---|---|
| Search data 000 | match<br>ML1_1: X<br>ML1_2: ○<br>ML1_3: ○ | mismatch<br>ML1_1: X<br>ML1_2: X<br>ML1_3: ○ | mismatch<br>ML1_1: X<br>ML1_2: X<br>ML1_3: X | mismatch<br>ML1_1: X<br>ML1_2: X<br>ML1_3: X |

-continued

| | Storage data 000 | Storage data 001 | Storage data 010 | Storage data 011 |
|---|---|---|---|---|
| Search data 001 | mismatch<br>ML1_1: ○<br>ML1_2: ○<br>ML1_3: ○ | match<br>ML1_1: X<br>ML1_2: ○<br>ML1_3: ○ | mismatch<br>ML1_1: X<br>ML1_2: X<br>ML1_3: ○ | mismatch<br>ML1_1: X<br>ML1_2: X<br>ML1_3: X |
| Search data 010 | mismatch<br>ML1_1: ○<br>ML1_2: ○<br>ML1_3: ○ | mismatch<br>ML1_1: ○<br>ML1_2: ○<br>ML1_3: ○ | match<br>ML1_1: X<br>ML1_2: ○<br>ML1_3: ○ | mismatch<br>ML1_1: X<br>ML1_2: X<br>ML1_3: ○ |
| Search data 011 | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: ○ | match<br>ML1_1: X<br>ML1_2: ○<br>ML1_3: ○ |
| Search data 100 | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: ○ |
| Search data 101 | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: ○ |
| Search data 110 | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: ○ |
| Search data 111 | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: ○ |
| Search data WC | match<br>ML1_1: X<br>ML1_2: ○<br>ML1_3: ○ | match<br>ML1_1: X<br>ML1_2: ○<br>ML1_3: ○ | match<br>ML1_1: X<br>ML1_2: ○<br>ML1_3: ○ | match<br>ML1_1: X<br>ML1_2: ○<br>ML1_3: ○ |

| | Storage data 100 | Storage data 101 | Storage data 110 | Storage data 111 | Storage data XXX |
|---|---|---|---|---|---|
| Search data 000 | mismatch<br>ML1_1: X<br>ML1_2: X<br>ML1_3: X | mismatch<br>ML1_1: X<br>ML1_2: X<br>ML1_3: X | mismatch<br>ML1_1: X<br>ML1_2: X<br>ML1_3: X | mismatch<br>ML1_1: X<br>ML1_2: X<br>ML1_3: X | match<br>ML1_1: X<br>ML1_2: ○<br>ML1_3: ○ |
| Search data 001 | mismatch<br>ML1_1: X<br>ML1_2: X<br>ML1_3: X | mismatch<br>ML1_1: X<br>ML1_2: X<br>ML1_3: X | mismatch<br>ML1_1: X<br>ML1_2: X<br>ML1_3: X | mismatch<br>ML1_1: X<br>ML1_2: X<br>ML1_3: X | match<br>ML1_1: X<br>ML1_2: ○<br>ML1_3: ○ |
| Search data 010 | mismatch<br>ML1_1: X<br>ML1_2: X<br>ML1_3: X | mismatch<br>ML1_1: X<br>ML1_2: X<br>ML1_3: X | mismatch<br>ML1_1: X<br>ML1_2: X<br>ML1_3: X | mismatch<br>ML1_1: X<br>ML1_2: X<br>ML1_3: X | match<br>ML1_1: X<br>ML1_2: ○<br>ML1_3: ○ |
| Search data 011 | mismatch<br>ML1_1: X<br>ML1_2: X<br>ML1_3: ○ | mismatch<br>ML1_1: X<br>ML1_2: X<br>ML1_3: X | mismatch<br>ML1_1: X<br>ML1_2: X<br>ML1_3: X | mismatch<br>ML1_1: X<br>ML1_2: X<br>ML1_3: X | match<br>ML1_1: X<br>ML1_2: ○<br>ML1_3: ○ |
| Search data 100 | mismatch<br>ML1_1: X<br>ML1_2: ○<br>ML1_3: ○ | mismatch<br>ML1_1: X<br>ML1_2: X<br>ML1_3: ○ | mismatch<br>ML1_1: X<br>ML1_2: X<br>ML1_3: X | mismatch<br>ML1_1: X<br>ML1_2: X<br>ML1_3: X | match<br>ML1_1: X<br>ML1_2: ○<br>ML1_3: ○ |
| Search data 101 | mismatch<br>ML1_1: ○<br>ML1_2: ○<br>ML1_3: ○ | mismatch<br>ML1_1: X<br>ML1_2: ○<br>ML1_3: ○ | mismatch<br>ML1_1: X<br>ML1_2: ○<br>ML1_3: ○ | mismatch<br>ML1_1: X<br>ML1_2: X<br>ML1_3: X | match<br>ML1_1: X<br>ML1_2: ○<br>ML1_3: ○ |
| Search data 110 | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: X<br>ML1_2: ○<br>ML1_3: ○ | mismatch<br>ML1_1: X<br>ML1_2: X<br>ML1_3: ○ | match<br>ML1_1: X<br>ML1_2: ○<br>ML1_3: ○ |
| Search data 111 | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: X<br>ML1_2: ○<br>ML1_3: ○ | match<br>ML1_1: X<br>ML1_2: ○<br>ML1_3: ○ |
| Search data WC | match<br>ML1_1: X<br>ML1_2: ○<br>ML1_3: ○ | match<br>ML1_1: X<br>ML1_2: ○<br>ML1_3: ○ | match<br>ML1_1: X<br>ML1_2: ○<br>ML1_3: ○ | match<br>ML1_1: X<br>ML1_2: ○<br>ML1_3: ○ | match<br>ML1_1: X<br>ML1_2: ○<br>ML1_3: ○ |

As shown in the above table, when the storage data is "000" while the search data is "000", the voltage on the first match line ML1_1 is kept while the second match line ML1_2 and the third match line ML1_3 are discharged which represents the search result is match; and when the storage data is "000" while the search data is "001", the first match line ML1_1 to the third match line ML1_3 are all discharged which represents the search result is mismatch. When the storage data is "XXX", no matter the value of the search data, the search result is match. When the search data is "WC", no matter the value of the storage data, the search result is match.

In the seventh embodiment of the application, the threshold voltage (i.e. a first threshold voltage) of the first transistor T1 is higher than the threshold voltage (i.e. a second threshold voltage) of the second transistor T2 and the threshold voltage (i.e. a third threshold voltage) of the third transistor T3; the first search voltage (i.e. the search voltage applied to the first search line SL1_1) is the same as the second search voltage (i.e. the search voltage applied to the second search line SL1_2) and the third search voltage (i.e. the search voltage applied to the third search line SL1_3); when the search data is a first predetermined search data (i.e. "000"), the first, the second and the third search voltages are a minimum search voltage; and when the search data is a second predetermined search data (i.e. "111"), the first, the second and the third search voltages are a maximum search voltage.

Eighth Embodiment

Figure 8:
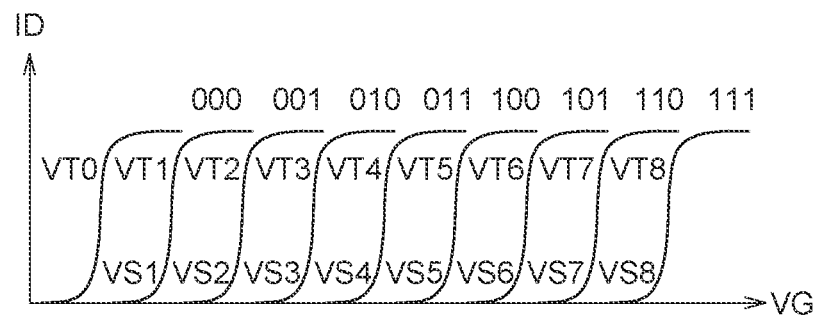
FIG. 8 shows a CAM cell and operations thereof according to an eighth embodiment of the application.
Figure 8:
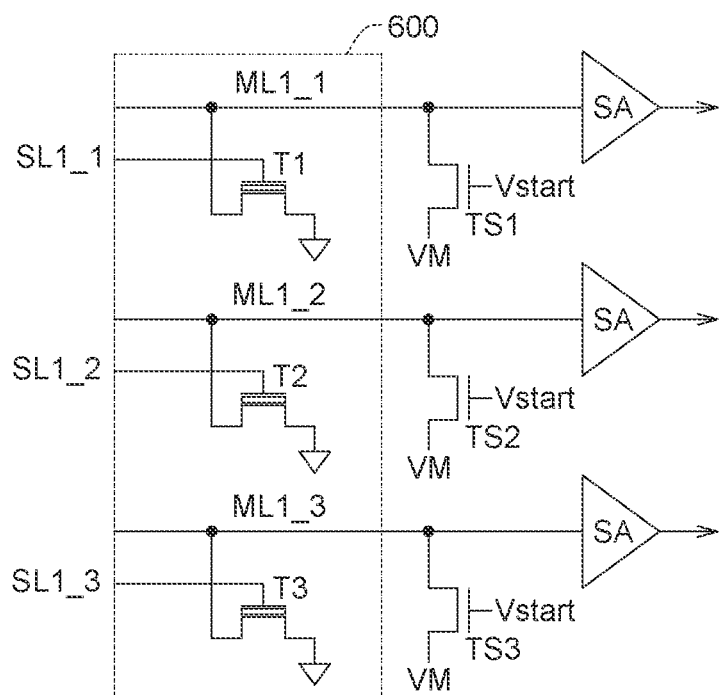

FIG. 8 shows a CAM cell and operations thereof according to an eighth embodiment of the application.

The following table shows the search voltages, the threshold voltages and the search results according to the first embodiment of the application.

| Search data | 000 | 001 | 010 | 011 | 100 | 101 | 110 | 111 | WC |
|---|---|---|---|---|---|---|---|---|---|
| SL1_1 | VS1 | VS2 | VS3 | VS4 | VS5 | VS6 | VS7 | VS8 | VS8 |
| SL1_2 | VS1 | VS2 | VS3 | VS4 | VS5 | VS6 | VS7 | VS8 | VS8 |
| SL1_3 | VS1 | VS2 | VS3 | VS4 | VS5 | VS6 | VS7 | VS8 | VS1 |
| Storage data | 000 | 001 | 010 | 011 | 100 | 101 | 110 | 111 | WC |
| VT_T1 | VT0 | VT0 | VT1 | VT2 | VT3 | VT4 | VT5 | VT6 | VT0 |
| VT_T2 | VT0 | VT1 | VT2 | VT3 | VT4 | VT5 | VT6 | VT7 | VT0 |
| VT_T3 | VT1 | VT2 | VT3 | VT4 | VT5 | VT6 | VT7 | VT8 | VT8 |
| Search data | 000 | 001 | 010 | 011 | 100 | 101 | 110 | 111 | |
| ML1_1 | X | ○ | ○ | ○ | ○ | ○ | ○ | ○ | |
| ML1_2 | X | X | ○ | ○ | ○ | ○ | ○ | ○ | |
| ML1_3 | X | X | X | ○ | ○ | ○ | ○ | ○ | |

(Storage data: 010) (X: keep potential; ○: discharge)

In the eighth embodiment of the application, when threshold voltages VT_T1 VT_T2 and VT_T3 of the transistors T1-T3 are VT0,VT0 and VT0, respectively, storage data of the CAM cell 600 is "000"; when threshold voltages VT_T1, VT_T2 and VT_T3 of the transistors T1-T3 are VT0, VT1 and VT2, respectively, storage data of the CAM cell 600 is "001"; when threshold voltages VT_T1, VT_T2 and VT_T3 of the transistors T1-T3 are VT1, VT2 and VT3, respectively, storage data of the CAM cell 600 is "010"; when threshold voltages VT_T1, VT_T2 and VT_T3 of the transistors T1-T3 are VT2, VT3 and VT4, respectively, storage data of the CAM cell 600 is "011"; when threshold voltages VT_T1, VT_T2 and VT_T3 of the transistors T1-T3 are VT3, VT4 and VT5, respectively, storage data of the CAM cell 600 is "100"; when threshold voltages VT_T1, VT_T2 and VT_T3 of the transistors T1-T3 are VT4, VT5 and VT6, respectively, storage data of the CAM cell 600 is "101"; when threshold voltages VT_T1, VT_T2 and VT_T3 of the transistors T1-T3 are VT5, VT6 and VT7, respectively, storage data of the CAM cell 600 is "110"; and when threshold voltages VT_T1, VT_T2 and VT_T3 of the transistors T1-T3 are VT6, VT7 and VT8, respectively, storage data of the CAM cell 600 is "111". Further, when threshold voltages VT_T1, VT_T2 and VT_T3 of the transistors T1-T3 are VT0, VT0 and VT8, respectively, storage data of the CAM cell 600 is "XXX" (don't care).

In searching, when search voltages applied to the first search line SL1_1, the second search line SL1_2 and the third search line SL1_3 are VS1, VS1 and VS1, respectively, search data is "000"; when search voltages applied to the first search line SL1_1, the second search line SL1_2 and the third search line SL1_3 are VS2, VS2 and VS2, respectively, search data is "001"; when search voltages applied to the first search line SL1_1, the second search line SL1_2 and the third search line SL1_3 are VS3, VS3 and VS3, respectively, search data is "010"; when search voltages applied to the first search line SL1_1, the second search line SL1_2 and the third search line SL1_3 are VS4, VS4 and VS4, respectively, search data is "011"; when search voltages applied to the first search line SL1_1, the second search line SL1_2 and the third search line SL1_3 are VS5, VS5 and VS5, respectively, search data is "100"; when search voltages applied to the first search line SL1_1, the second search line S1_2 and the third search line SL1_3 are VS6, VS6 and VS6, respectively, search data is "101"; when search voltages applied to the first search line SL1_1, the second search line SL1_2 and the third search line SL1_3 are VS7, VS7 and VS7, respectively, search data is "110"; when search voltages applied to the first search line SL1_1, the second search line SL1_2 and the third search line SL1_3 are VS8, VS8 and VS8, respectively, search data is "111"; and when search voltages applied to the first search line SL1_1, the second search line SL1_2 and the third search line SL1_3 are VS8, VS8 and VS1, respectively, search data is "WC".

In the eighth embodiment of the application, the threshold voltages VT0, VT1, VT2, VT3, VT4, VT5, VT6, VT7 and VT8 are for example but not limited by, 0V, 1V, 2V, 3V, 4V, 5V, 6V, 7V and 8V; and the search voltages VS1, VS2, VS3, VS4, VS5, VS6, VS7 and VS8 are for example but not limited by 0.5V, 1.5V, 2.5V, 3.5V, 4.5V, 5.5V, 6.5V and 7.5V.

When the storage data of the CAM cell 600 is "010" and the search data is "010", the first match line ML1_1 and the second match line ML1_2 are discharged while potential of the third match line ML1_3 is kept, which refers to that the search result is matched, and so on.

Thus, in the eighth embodiment of the application, when the first match line ML1_1 and the second match line ML1_2 are discharged while potential of the third match line ML1_3 is kept, the storage data is matched with the search data; when the voltages on the second match line ML1_2 and the third match line ML1_3 are kept while the first match line ML1_1 is discharged, the storage data is mismatched with the search data; when the voltages on the first match line ML1_1 to the third match line ML1_3 are all kept, the storage data is mismatched with the search data; and the first match line ML1_1 to the third match line ML1_3 are all discharged, the storage data is mismatched with the search data.

The following table shows a search table according to the eighth embodiment of the application.

|  | Storage data 000 | Storage data 001 | Storage data 010 | Storage data 011 |
|---|---|---|---|---|
| Search data 000 | match<br>ML1_1: ○<br>ML1_2: ○<br>ML1_3: X | mismatch<br>ML1_1: ○<br>ML1_2: X<br>ML1_3: X | mismatch<br>ML1_1: X<br>ML1_2: X<br>ML1_3: X | mismatch<br>ML1_1: X<br>ML1_2: X<br>ML1_3: X |
| Search data 001 | mismatch<br>ML1_1: ○<br>ML1_2: ○<br>ML1_3: ○ | match<br>ML1_1: ○<br>ML1_2: ○<br>ML1_3: X | mismatch<br>ML1_1: ○<br>ML1_2: X<br>ML1_3: X | mismatch<br>ML1_1: X<br>ML1_2: X<br>ML1_3: X |
| Search data 010 | mismatch<br>ML1_1: ○<br>ML1_2: ○<br>ML1_3: ○ | mismatch<br>ML1_1: ○<br>ML1_2: ○<br>ML1_3: ○ | match<br>ML1_1: ○<br>ML1_2: ○<br>ML1_3: X | mismatch<br>ML1_1: ○<br>ML1_2: ○<br>ML1_3: X |
| Search data 011 | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: ○ | match<br>ML1_1: ○<br>ML1_2: ○<br>ML1_3: X |
| Search data 100 | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: ○ |
| Search data 101 | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: ○ |
| Search data 110 | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: ○ |
| Search data 111 | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: ○ |
| Search data WC | match<br>ML1_1: ○<br>ML1_2: ○<br>ML1_3: X | match<br>ML1_1: ○<br>ML1_2: ○<br>ML1_3: X | match<br>ML1_1: ○<br>ML1_2: ○<br>ML1_3: X | match<br>ML1_1: ○<br>ML1_2: ○<br>ML1_3: X |

|  | Storage data 100 | Storage data 101 | Storage data 110 | Storage data 111 | Storage data XXX |
|---|---|---|---|---|---|
| Search data 000 | mismatch<br>ML1_1: X<br>ML1_2: X<br>ML1_3: X | mismatch<br>ML1_1: X<br>ML1_2: X<br>ML1_3: X | mismatch<br>ML1_1: X<br>ML1_2: X<br>ML1_3: X | mismatch<br>ML1_1: X<br>ML1_2: X<br>ML1_3: X | match<br>ML1_1: ○<br>ML1_2: ○<br>ML1_3: X |
| Search data 001 | mismatch<br>ML1_1: X<br>ML1_2: X<br>ML1_3: X | mismatch<br>ML1_1: X<br>ML1_2: X<br>ML1_3: X | mismatch<br>ML1_1: X<br>ML1_2: X<br>ML1_3: X | mismatch<br>ML1_1: X<br>ML1_2: X<br>ML1_3: X | match<br>ML1_1: ○<br>ML1_2: ○<br>ML1_3: X |
| Search data 010 | mismatch<br>ML1_1: X<br>ML1_2: X<br>ML1_3: X | mismatch<br>ML1_1: X<br>ML1_2: X<br>ML1_3: X | mismatch<br>ML1_1: X<br>ML1_2: X<br>ML1_3: X | mismatch<br>ML1_1: X<br>ML1_2: X<br>ML1_3: X | match<br>ML1_1: ○<br>ML1_2: ○<br>ML1_3: X |
| Search data 011 | mismatch<br>ML1_1: ○<br>ML1_2: X<br>ML1_3: X | mismatch<br>ML1_1: X<br>ML1_2: X<br>ML1_3: X | mismatch<br>ML1_1: X<br>ML1_2: X<br>ML1_3: X | mismatch<br>ML1_1: X<br>ML1_2: X<br>ML1_3: X | match<br>ML1_1: ○<br>ML1_2: ○<br>ML1_3: X |
| Search data 100 | mismatch<br>ML1_1: ○<br>ML1_2: ○<br>ML1_3: X | mismatch<br>ML1_1: ○<br>ML1_2: ○<br>ML1_3: X | mismatch<br>ML1_1: X<br>ML1_2: X<br>ML1_3: X | mismatch<br>ML1_1: X<br>ML1_2: X<br>ML1_3: X | match<br>ML1_1: ○<br>ML1_2: ○<br>ML1_3: X |
| Search data 101 | mismatch<br>ML1_1: ○<br>ML1_2: ○<br>ML1_3: ○ | mismatch<br>ML1_1: ○<br>ML1_2: ○<br>ML1_3: X | mismatch<br>ML1_1: ○<br>ML1_2: X<br>ML1_3: X | mismatch<br>ML1_1: X<br>ML1_2: X<br>ML1_3: X | match<br>ML1_1: ○<br>ML1_2: ○<br>ML1_3: X |

| | | | | | |
|---|---|---|---|---|---|
| Search data 110 | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: X | mismatch<br>ML1_1: ○<br>ML1_2: X<br>ML1_3: X | match<br>ML1_1: ○<br>ML1_2: ○<br>ML1_3: X |
| Search data 111 | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: ○ | mismatch<br>ML1_1: ○<br>ML1_2: ○<br>ML1_3: X | match<br>ML1_1: ○<br>ML1_2: ○<br>ML1_3: X |
| Search data WC | match<br>ML1_1: ○<br>ML1_2: ○<br>ML1_3: X | match<br>ML1_1: ○<br>ML1_2: ○<br>ML1_3: X | match<br>ML1_1: ○<br>ML1_2: ○<br>ML1_3: X | match<br>ML1_1: ○<br>ML1_2: ○<br>ML1_3: X | match<br>ML1_1: ○<br>ML1_2: ○<br>ML1_3: X |

As shown in the above table, when the storage data is "000" while the search data is "000", the voltage on the third match line ML1_3 is kept while the first match line ML1_1 and the second match line ML1_2 are discharged which represents the search result is match; and when the storage data is "000" while the search data is "001", the first match line ML1_1 to the third match line ML1_3 are all discharged which represents the search result is mismatch. When the storage data is "XXX", no matter the value of the search data, the search result is match. When the search data is "WC", no matter the value of the storage data, the search result is match.

In the eighth embodiment of the application, the threshold voltage (i.e. a third threshold voltage) of the third transistor T3 is higher than the threshold voltage (i.e. a first threshold voltage) of the first transistor T1 and the threshold voltage (i.e. a second threshold voltage) of the second transistor T2; the first search voltage (i.e. the search voltage applied to the first search line SL1_1) is the same as the second search voltage (i.e. the search voltage applied to the second search line SL1_2) and the third search voltage (i.e. the search voltage applied to the third search line SL1_3); when the search data is a first predetermined search data (i.e. "000"), the first, the second and the third search voltages are a minimum search voltage; and when the search data is a second predetermined search data (i.e. "111"), the first, the second and the third search voltages are a maximum search voltage.

Figure 9:
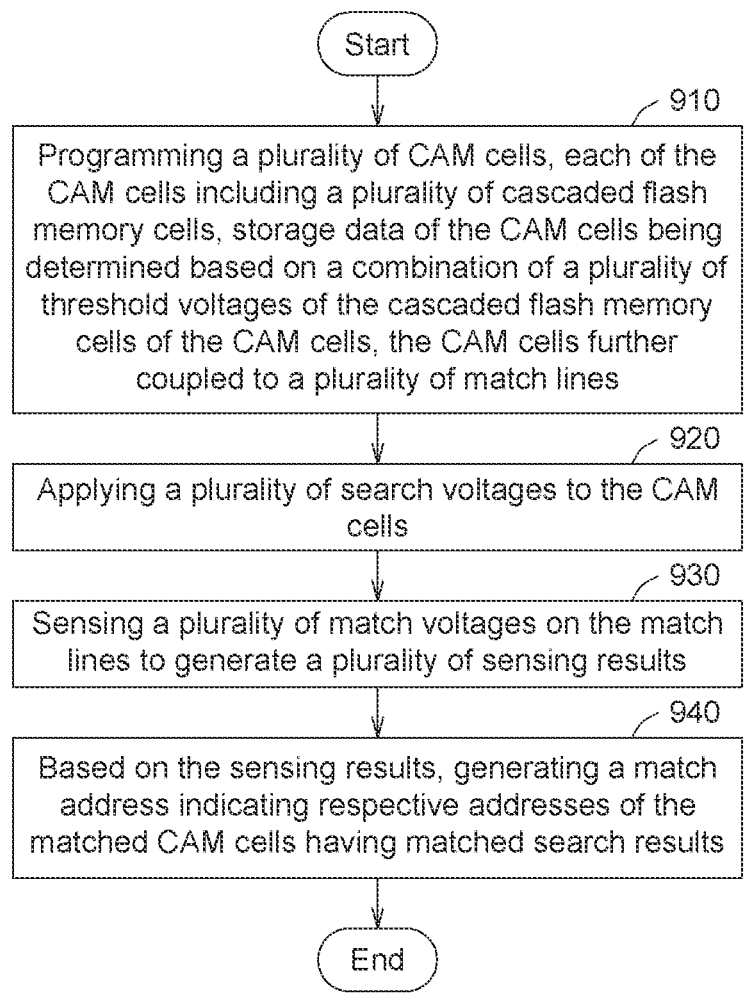
FIG. 9 shows an operation method for a CAM memory device according to a ninth embodiment of the application.

FIG. 9 shows an operation method for a CAM memory device according to a ninth embodiment of the application. The operation method for the CAM memory device according to the ninth embodiment includes: in step 910, programming a plurality of CAM cells, each of the CAM cells including a plurality of parallel-coupled flash memory cells, storage data of the CAM cells being determined based on a combination of a plurality of threshold voltages of the parallel-coupled flash memory cells of the CAM cells, the CAM cells further coupled to a plurality of match lines; in step 920, applying a plurality of search voltages to the CAM cells; in step 930, sensing a plurality of match voltages on the match lines to generate a plurality of sensing results; and in step 940, based on the sensing results, generating a match address indicating respective addresses of the matched CAM cells having matched search results.

Details of the steps 910-940 are described in the above embodiments and thus are omitted.

In the above embodiments, the CAM cell may be implemented by: a multi-level CAM cell storing two-bit, a triple-level CAM cell storing three-bit, a quad-level CAM cell storing four-bit or a penta-level CAM storing five-bit or other similar memory cells, which are still within the spirit and the scope of the application.

In the above embodiments, the CAM memory device may have two-dimension (2D) or 3D flash memory structure, which are still within the spirit and the scope of the application.

In the above embodiments, in order to improve in-memory searching (IMS) density and match speed, the match result is distinguished b different combinations of the match line voltages; multi-level and higher-level NOR flash memory cells are used.

In the above embodiments, the NOR flash TCAM structure may provide high on/off ratio, for example higher than $10^6$. The embodiments of the application may improve match accuracy and is suitable for long word search design. Thus, when the CAM cells and the CAM memory device according to the embodiments of the application are used in big data search, the in-memory search density is improved.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A content addressable memory (CAM) cell including:
   a plurality of parallel-coupled flash memory cells;
   wherein a storage data of the CAM cell is based on a combination of a plurality of threshold voltages of the parallel-coupled flash memory cells, and the plurality of threshold voltages of the parallel-coupled flash memory cells are selected among a maximum threshold voltage, a minimum threshold voltage and an intermediate threshold voltage.

2. The CAM cell according to claim 1, wherein
   the threshold voltages of the parallel-coupled flash memory cells are the same; or
   one of the threshold voltages of the parallel-coupled flash memory cells is higher than another of the threshold voltages of the parallel-coupled flash memory cells.

3. The CAM cell according to claim 1, wherein
   when the storage data is a first predetermined storage data, a first threshold voltage of a first flash memory cell of the parallel-coupled flash memory cells and a second threshold voltage of a second flash memory cell of the parallel-coupled flash memory cells are both the minimum threshold voltage; and
   when the storage data is a second predetermined storage data, the first threshold voltage and the second threshold voltage are both the maximum threshold voltage.

4. The CAM cell according to claim 1, wherein
   when the storage data is a first predetermined storage data, a second threshold voltage of a second flash memory cell of the parallel-coupled flash memory cells is the minimum threshold voltage and a first threshold voltage of a first flash memory cell of the parallel-coupled flash memory cells is higher than the second threshold voltage; and when the storage data is a second predetermined storage data, the first threshold voltage is the maximum threshold voltage and the first threshold voltage is higher than the second threshold voltage.

5. The CAM cell according to claim 1, wherein
when the storage data is a third predetermined storage data, one of the threshold voltages of the parallel-coupled flash memory cells is the minimum threshold voltage and another of the threshold voltages of the parallel-coupled flash memory cells is the maximum threshold voltage.

6. A content addressable memory (CAM) memory device including:
a plurality of CAM cells each including a plurality of parallel-coupled flash memory cells, wherein a storage data of each of the CAM cells is based on a combination of a plurality of threshold voltages of the parallel-coupled flash memory cells of each of the CAM cells, and the plurality of threshold voltages of the parallel-coupled flash memory cells are selected among a maximum threshold voltage, a minimum threshold voltage and an intermediate threshold voltage;
a plurality of search lines coupled to the CAM cells;
a plurality of match lines coupled to the CAM cells;
a plurality of sensing amplifiers coupled to the match lines; and
a decoder coupled to the sensing amplifiers,
wherein
when a plurality of search voltages are applied to the CAM cells via the search lines, the sensing amplifiers sense a plurality of match voltages on the match lines to generate a plurality of sensing results; and
based on the sensing results, the decoder generates a match address indicating respective addresses of the matched CAM cells having matched search results.

7. The CAM memory device according to claim 6, wherein in the CAM cell,
the threshold voltages of the parallel-coupled flash memory cells are the same; or
one of the threshold voltages of the parallel-coupled flash memory cells is higher than another of the threshold voltages of the parallel-coupled flash memory cells.

8. The CAM memory device according to claim 6, wherein
in the CAM cell, when the storage data is a first predetermined storage data, a first threshold voltage of a first flash memory cell of the parallel-coupled flash memory cells and a second threshold voltage of a second flash memory cell of the parallel-coupled flash memory cells are both the minimum threshold voltage; and
when the storage data is a second predetermined storage data, the first threshold voltage and the second threshold voltage are both the maximum threshold voltage, and a first search voltage among the search voltages is lower than a second search voltage among the search voltages,
wherein when one of the match voltages is kept while another of the match voltages is discharged, the search result is matched.

9. The CAM memory device according to claim 6, wherein
in the CAM cell, when the storage data is a first predetermined storage data, a second threshold voltage of a second flash memory cell of the parallel-coupled flash memory cells is the minimum threshold voltage and a first threshold voltage of a first flash memory cell of the parallel-coupled flash memory cells is higher than the second threshold voltage; and when the storage data is a second predetermined storage data, the first threshold voltage is the maximum threshold voltage and the first threshold voltage is higher than the second threshold voltage;

the search voltages are the same; when a search data is a first predetermined search data, the search voltages are a minimum search voltage and when the search data is a second predetermined search data, the search voltages are a maximum search voltage, wherein when one of the match voltages is kept while another of the match voltages is discharged, the search result is matched.

10. The CAM memory device according to claim 6, wherein
in the CAM cell, when the storage data is a third predetermined storage data, one of the threshold voltages of the parallel-coupled flash memory cells is the minimum threshold voltage and another of the threshold voltages of the parallel-coupled flash memory cells is the maximum threshold voltage; and
the search voltages are the same; when a search data is a first predetermined search data, the search voltages are a minimum search voltage and when the search data is a second predetermined search data, the search voltages are a maximum search voltage,
wherein when one of the match voltages is kept while another of the match voltages is discharged, the search result is matched.

11. An operation method for a content addressable memory (CAM) memory device, the operation method including:
programming a plurality of CAM cells each including a plurality of parallel-coupled flash memory cells, wherein a storage data of each of the CAM cells is based on a combination of a plurality of threshold voltages of the parallel-coupled flash memory cells of each of the CAM cells, the plurality of threshold voltages of the parallel-coupled flash memory cells are selected among a maximum threshold voltage, a minimum threshold voltage and an intermediate threshold voltage, and the CAM cells further coupled to a plurality of match lines;
applying a plurality of search voltages to the CAM cells;
sensing a plurality of match voltages on the match lines to generate a plurality of sensing results; and
based on the sensing results, generating a match address indicating respective addresses of the matched CAM cells having matched search results.

12. The operation method for the CAM memory device according to claim 11, wherein in programming the CAM cell,
the threshold voltages of the parallel-coupled flash memory cells are programmed to the same; or
one of the threshold voltages of the parallel-coupled flash memory cells is programmed to be higher than another of the threshold voltages of the parallel-coupled flash memory cells.

13. The operation method for the CAM memory device according to claim 11, wherein
in the CAM cell, when the storage data is a first predetermined storage data, a first threshold voltage of a first flash memory cell of the parallel-coupled flash memory cells and a second threshold voltage of a second flash memory cell of the parallel-coupled flash memory cells are both the minimum threshold voltage; and when the storage data is a second predetermined storage data, the first threshold voltage and the second threshold voltage are both the maximum threshold voltage, and a first search voltage among the search voltages is lower than a second search voltage among the search voltages, wherein when one of the match voltages is kept while another of the match voltages is discharged, the search result is matched.

14. The operation method for the CAM memory device according to claim 11, wherein in the CAM cell, when the storage data is a first predetermined storage data, a second threshold voltage of a second flash memory cell of the parallel-coupled flash memory cells is the minimum threshold voltage and a first threshold voltage of a first flash memory cell of the parallel-coupled flash memory cells is higher than the second threshold voltage; and when the storage data is a second predetermined storage data, the first threshold voltage is the maximum threshold voltage and the first threshold voltage is higher than the second threshold voltage;

the search voltages are the same; when a search data is a first predetermined search data, the search voltages are a minimum search voltage and when the search data is a second predetermined search data, the search voltages are a maximum search voltage, wherein when one of the match voltages is kept while another of the match voltages is discharged, the search result is matched.

15. The operation method for the CAM memory device according to claim 11, wherein in the CAM cell, when the storage data is a third predetermined storage data, one of the threshold voltages of the parallel-coupled flash memory cells is the minimum threshold voltage and another of the threshold voltages of the parallel-coupled flash memory cells is the maximum threshold voltage; and the search voltages are the same; when a search data is a first predetermined search data, the search voltages are a minimum search voltage and when the search data is a second predetermined search data, the search voltages are a maximum search voltage, wherein when one of the match voltages is kept while another of the match voltages is discharged, the search result is matched.

* * * * *